(12) United States Patent
Xin et al.

(10) Patent No.: US 11,824,132 B2
(45) Date of Patent: Nov. 21, 2023

(54) INDIRECT BANDGAP, PEROVSKITE-BASED X-RAY DETECTOR AND METHOD

(71) Applicant: KING ABDULLAH UNIVERSITY OF SCIENCE AND TECHNOLOGY, Thuwal (SA)

(72) Inventors: Bin Xin, Thuwal (SA); Iman S. Roqan, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 91 days.

(21) Appl. No.: 17/603,031

(22) PCT Filed: Apr. 23, 2020

(86) PCT No.: PCT/IB2020/053868
§ 371 (c)(1),
(2) Date: Oct. 12, 2021

(87) PCT Pub. No.: WO2020/222094
PCT Pub. Date: Nov. 5, 2020

(65) Prior Publication Data
US 2022/0190182 A1 Jun. 16, 2022

Related U.S. Application Data

(60) Provisional application No. 62/839,878, filed on Apr. 29, 2019.

(51) Int. Cl.
*H01L 31/08* (2006.01)
*G01T 1/24* (2006.01)
*H01L 31/0224* (2006.01)
*H01L 31/032* (2006.01)

(52) U.S. Cl.
CPC ............ *H01L 31/085* (2013.01); *G01T 1/241* (2013.01); *H01L 31/022408* (2013.01); *H01L 31/032* (2013.01)

(58) Field of Classification Search
CPC ........... H01L 31/085; H01L 31/022408; H01L 31/032; G01T 1/241
See application file for complete search history.

(56) References Cited

U.S. PATENT DOCUMENTS

2017/0160405 A1* 6/2017 Kim ........................ G01T 1/201
2018/0277608 A1 9/2018 Lifka et al.
(Continued)

OTHER PUBLICATIONS

Birowosuto, M.D., et al., "X-ray Scintillation in Lead Halide Perovskite Crystals," Scientific Reports, vol. 6, Article 37254, Nov. 16, 2016, pp. 1-10.
(Continued)

*Primary Examiner* — Hugh Maupin
(74) *Attorney, Agent, or Firm* — PATENT PORTFOLIO BUILDERS PLLC

(57) ABSTRACT

An X-ray system includes an X-ray generation unit configured to generate X-rays; an X-ray detection unit including at least one X-ray sensor that includes an indirect bandgap, perovskite semiconductor material, the X-ray sensor being configured to record the X-rays; and a control unit that controls a generation of the X-rays and a detection of the X-rays at the X-ray detection unit.

20 Claims, 22 Drawing Sheets

(56) References Cited

U.S. PATENT DOCUMENTS

2019/0257959 A1* 8/2019 Thirimanne ........... B82Y 30/00
2020/0325391 A1* 10/2020 Kim ........................ H01L 33/06

OTHER PUBLICATIONS

Chen, Q., et al., "All-inorganic perovskite nanocrystal scintillators," Nature, vol. 561, No. 7721, Sep. 6, 2018 (Published online Aug. 27, 2018), pp. 88-93 (22 pages total).

Heo, J.H., et al., "High-Performance Next-Generation Perovskite Nanocrystal Scintillator for Nondestructive X-Ray Imaging," Advanced Materials, vol. 30, No. 40, Article 1801743, 2018 (Published online Aug. 23, 2018), pp. 1-6.

Liu, X., et al., "Enhanced X-ray photon response in solution-synthesized $CsPbBr_3$ nanoparticles wrapped by reduced graphene oxide," Solar Energy Materials and Solar Cells, vol. 187, 2018 (Available online Aug. 23, 2018), pp. 249-254.

Nagarkar, V.V., et al., "Structured CsI(Tl) Scintillators for X-ray Imaging Applications," IEEE Transactions on Nuclear Science, vol. 45, No. 3, Jul. 1998, pp. 492-496 (6 pages total).

Pan, W., et al., "$Cs_2AgBiBr_6$ single-crystal X-ray detectors with a low detection limit," Nature Photonics, vol. 11, Nov. 2017 (Published online Oct. 2, 2017), pp. 25-32 (9 pages total).

PCT International Search Report and Written Opinion of the International Searching Authority (Forms PCT/ISA/220, PCT/ISA/210 and PCT/ISA/237) for International Application No. PCT/IB2020/053868 dated Jul. 9, 2020.

Protesescu, L., et al., "Nanocrystals of Cesium Lead Halide Perovskites ($CsPbX_3$, X =Cl, Br, and I): Novel Optoelectronic Materials Showing Bright Emission with Wide Color Gamut," Nano Letters, vol. 15, Jan. 29, 2015, pp. 3692-3696.

Xin, B., et al., "Self-Patterned $CsPbBr_3$ Nanocrystals for High-Performance Optoelectronics," ACS Applied Materials & Interfaces, vol. 11, No. 5, Jan. 8, 2019, pp. 5223-5231 (10 pages total).

Yakunin, S., et al., "Detection of X-ray photons by solution-processed lead halide perovskites," Nature Photonics, vol. 9, No. 7, Jul. 2015 (Published online May 25, 2015), pp. 444-449 (8 pages total).

Zhang, Y., et al., "Metal Halide Perovskite Nanosheet for X-ray High-Resolution Scintillation Imaging Screens," ACS Nano, vol. 13, Feb. 5, 2019, pp. 2520-2525.

Buchele, P., et al., "X-Ray Imaging with Scintillator-Sensitized Hybrid Organic Photodetectors," Nature Photonics, Nov. 9, 2015, vol. 9, pp. 843-847, Macmillan Publishers Limited.

Moretti, F., et al., "Radioluminescence Sensitization in Scintillators and Phosphors: Trap Engineering and Modeling," The Journal of Physical Chemistry, Apr. 15, 2014, vol. 118, pp. 9670-9676, American Chemical Society.

Shrestha, S., et al., "High-Performance Direct Conversion X-Ray Detectors Based on Sintered Hybrid Lead Triiodide Perovskite Wafers," Nature Photonics, Jun. 19, 2017, vol. 11, pp. 436-440, Macmillan Publishers Limited.

Wei, H., et al., "Sensitive X-Ray Detectors Made of Methylammonium Lead Tribromide Perovskite Single Crystals," Nature Photonics, Mar. 21, 2016, vol. 10, pp. 333-339, Macmillan Publishers Limited.

\* cited by examiner

INDIRECT BANDGAP, PEROVSKITE-BASED X-RAY DETECTOR AND METHOD

CROSS-REFERENCE TO RELATED APPLICATIONS

This application is a U.S. National Stage Application of International Application No. PCT/IB2020/053868, filed on Apr. 23, 2020, which claims priority to U.S. Provisional Patent Application No. 62/839,878, filed on Apr. 29, 2019, entitled "INDIRECT BANDGAP CsPbX3-BASED X-RAY DETECTORS WITH LOW VISIBLE/UV LIGHT NOISE INTERFERENCE," the disclosures of which are incorporated herein by reference in their entirety.

BACKGROUND

Technical Field

Embodiments of the subject matter disclosed herein generally relate to a system and method for detecting X-rays, and more particularly, to a perovskite-based X-ray detector that uses an indirect bandgap material for enhancing the X-ray sensitivity and simultaneously diminishing visible and UV light interference.

Discussion of the Background

Due to the unique X-ray properties, X-ray detectors are utilized in many fields, such as medical diagnostics, luggage inspection, and industrial monitoring. In addition, certain scientific methods, such as those based on X-ray diffraction (XRD), rely on the interaction between X-rays and a crystal, whereas the X-ray photoelectron spectroscopy (XPS), energy-dispersive X-ray (EDX) spectroscopy, synchrotron radiation, etc., utilize the relationship between the incident X-ray energy and the core electron binding energy in the target elements.

Among these applications, medical diagnostics is particularly significant, but it presently requires a large X-ray dose and direct human exposure to radiation, which is harmful to human health, increasing the cancer risk, especially in children.

In the literature, use of the conventional materials for direct X-ray detection has been reported by several authors, including amorphous Se, crystalline Si, $PbI_2$, $HgI_2$, CdTe, and CdZnTe. However, such devices require expensive fabrication and processing methods. Thus, there is a high industrial demand for cost-effective highly sensitive X-ray detectors for mass production.

BRIEF SUMMARY OF THE INVENTION

According to an embodiment, there is an X-ray system that includes an X-ray generation unit configured to generate X-rays, an X-ray detection unit including at least one X-ray sensor that includes an indirect bandgap, perovskite semiconductor material, the X-ray sensor being configured to record the X-rays, and a control unit that controls a generation of the X-rays and a detection of the X-rays at the X-ray detection unit.

According to another embodiment, there is an X-ray sensor for determining X-ray radiation, and the X-ray sensor includes a substrate, an interdigitated contact electrode, IDE, formed on the substrate, the IDE having two trunks and each trunk having plural branches, and an indirect bandgap, perovskite semiconductor material deposited on the substrate, between the two trunks.

According to still another embodiment, there is a method for recording X-ray radiation, and the method includes sending X-ray radiation directly to an indirect bandgap, perovskite semiconductor material, which is deposited on a substrate, between two trunks of an interdigitated contact electrode, IDE, applying a current or voltage between the two trunks, and detecting a change in the current or voltage when the X-ray radiation interacts with the indirect bandgap, perovskite semiconductor material. The change is indicative of the X-ray radiation.

BRIEF DESCRIPTION OF THE DRAWINGS

For a more complete understanding of the present invention, reference is now made to the following descriptions taken in conjunction with the accompanying drawings, in which.

DETAILED DESCRIPTION OF THE INVENTION

Figure 1A:
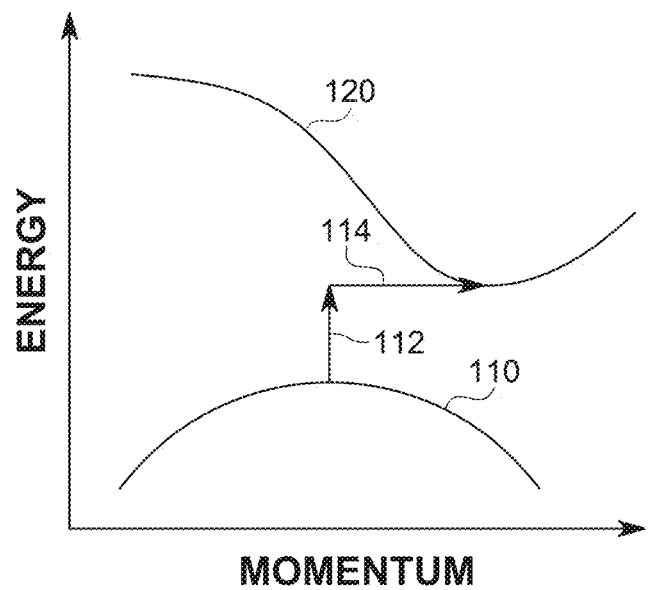
FIG. 1A is a schematic diagram of energy bands of an indirect bandgap, perovskite semiconductor material

The following description of the embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, with regard to an X-ray sensor that uses an indirect bandgap, perovskite based semiconductor material for detecting X-ray radiation. However, the embodiments to be discussed next are not limited to such a sensor, but may be applied to any system in which X-ray radiation is involved.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

According to an embodiment, an indirect bandgap, inorganic perovskite material is used in an X-ray detector to avoid the light interference issue. The X-ray detector based on this perovskite material can achieve a sensitivity of 83.6 µCGyair$^{-1}$ cm$^{-2}$ (which is superior when compared to the commercial x-ray detectors) with a very thin (~6.6 µm) active layer, which is desired for device miniaturization.

The inventors have observed that covalent bond semiconductors, as those discussed in the Background section, which are currently used in the X-ray detectors, require a high-temperature crystallization process, which is expensive and difficult to manufacture. The inventors have noted that ionic crystals can be processed from a solution at low temperatures. Particularly, lead halogen perovskite has emerged as a candidate for optoelectronic and photovoltaic applications due to its cost-effectiveness and high-crystal quality, as well as its high absorption cross-section, high illumination and ability to form quantum dots [1]. Moreover, perovskite-based devices can be fabricated by simple and cost-effective methods, such as ink-jet, spray coating, spin coating, drop casting, etc.

Thus far, halogen perovskite has been employed as an active layer in solar cells, lasers, LEDs, and photodetector applications, yielding the required high performance. In addition to the simple and inexpensive synthesis process associated with superior semiconducting properties, this material can also act as an active layer for X-ray detectors due to its high absorption arising from the high-Z atoms and high efficiency in converting incident energy into charge carriers. At present, two flat detector technologies prevail in the semiconductor detector field, based respectively on indirect conversion by the use of scintillators [2-7] and direct conversion of X-ray photons into electrical current. Consequently, perovskite materials based on the direct X-ray detection mode has the advantage of providing higher spatial resolution and simpler system configuration compared to the scintillators.

However, perovskite based X-ray detectors suffer from a severe light interference noise, which prevents them from being adopted in the field. The commercial X-ray detectors rely on very complex designs and materials to avoid light interference (for example, light suppressing layers formed over the active material). Thus, it is desired to overcome this light interference noise issue arising from the high photoelectric effect of the perovskite material when exposed to visible/UV light during the X-ray detection process. In other words, the use of the perovskite as the active material in X-ray detectors is today not possible because of the noise introduced by the visible and/or UV light. This phenomenon is undesirable for medical diagnostics and other industrial purposes that require a high X-ray sensitivity.

Thus, based on this need of having X-ray detectors possessing both high-sensitivity and high-resolution, the inventors have developed an X-ray detector that uses an indirect bandgap perovskite (e.g., CsPb(Br$_x$I$_{1-x}$)$_3$, with x<1) material for the active layer. The X-ray detector's sensitivity has been shown to reach 83.6 µCGy$_{air}^{-1}$ cm$^{-2}$ while ensuring negligible response to the visible/UV light, thus mitigating the light interference noise. Moreover, in one embodiment, an ultra-thin active layer (6.6 µm, but this layer can have a thickness of up to 10 µm) is sufficient to attain these benefits, allowing device miniaturization without affecting its spatial resolution, which is comparable to the response yielded by devices based on a much thicker active layer (ranging from hundreds of microns to millimeters) reported by others [8-11].

Various inorganic perovskites were prepared and tested to determine which one is the most appropriate for the X-ray detector. The various inorganic perovskites include four CsPbX$_3$ (X=I, Br) nanocrystals (NCs; a nanocrystal is a material particle having at least one dimension smaller than 100 nm) that were synthetized by a modified room-temperature co-precipitation method reported by G. Konstantatos et al. (F. Di Stasio, S. Christodoulou, N. Huo, G. Konstantatos. Chem Mater, 2017, 29, 7663). Even though the nominal elemental ratio of the resulting NCs for CsPb(Br$_x$I$_{1-x}$)$_3$ is not very accurate, those four perovskite samples are denoted herein as CsPbI$_3$, CsPbBrI$_2$, CsPbBr$_2$I and CsPbBr$_3$, respectively, based on the molar ratio of the halogen element used during the chemical synthesis. While the CsPbI$_3$, CsPbBrI$_2$, CsPbBr$_2$I materials are indirect bandgap perovskites, the CsPbBr$_3$ is a direct bandgap perovskite.

In one embodiment, the manufacturing method of these four perovskite materials used a Cs precursor and a PbX$_2$ precursor, which were prepared separately, and the reaction was initiated by injecting the latter into the former. Firstly, the Cs precursor solution was prepared by dissolving 32 mg CsAc (cesium acetate) in 1 mL isopropanol (IPA) in a 20 mL vial under stirring in air at room temperature (RT), followed by the addition of 6 mL n-hexane (Hex) and 2 mL IPA. Secondly, the PbX$_2$ precursor solution was prepared by dissolving 0.167 mmol PbX$_2$ (307.5 mg PbI$_2$ for CsPbI$_3$, 81.6 mg PbBr$_2$ and 205 mg PbI$_2$ for CsPbBrI$_2$, 163.2 mg PbBr$_2$ and 102.5 mg PbI$_2$ for CsPbBr$_2$I, 245 mg PbBr$_2$ for CsPbBr$_3$) into a mixture solution of 0.45-mL IPA, 0.45 mL Hexanoic acid and 0.45 mL octylamine (OcAm) at 90° C. in air under vigorous stirring. Thirdly, the hot PbX$_2$ precursor was swiftly injected into the Cs precursor under vigorous stirring at RT. The reaction completed in 2 minutes. It shows high illumination under UV exposure for $CsPbBr_3$ and $CsPbBrI_2$. The $CsPbX_3$ NCs were isolated by centrifugation at 3,000 rpm for 3 minutes, and the pellet was dispersed into 3-mL toluene. In the process of centrifugation, the $CsPbBrI_2$ NCs lost the illumination ability, implying a phase change during dispensation. Other methods may be used for generating these materials.

Figure 1B:
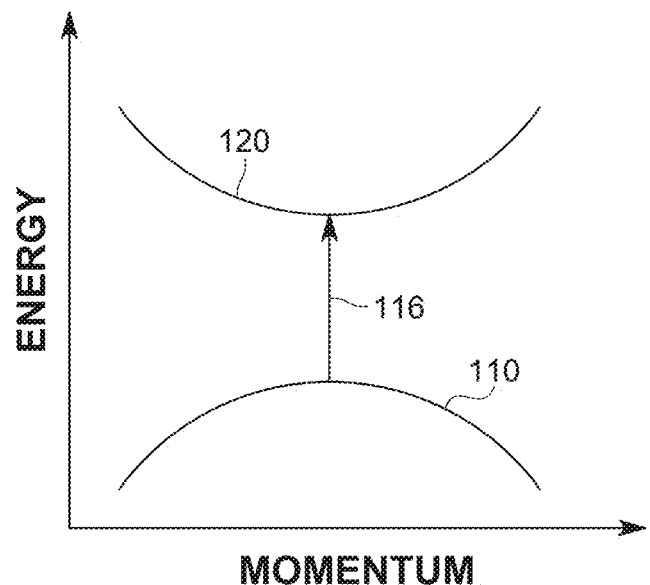
FIG. 1B is a schematic diagram of energy bands of a direct bandgap, perovskite semiconductor material.

The direct versus indirect bandgap feature is now discussed with regard to FIGS. 1A and 1B. A semiconductor device has a valence band 110 and a conduction band 120. The electrons reside in the valence band 110 when they are not excited. When excited, i.e., receive energy from an exterior source (for example, photoenergy from incoming light, which is carried by the photons, or electrical energy from an electrical field applied to the semiconductor device), the received energy is used by the electrons to jump from the valence band 110 to the conduction band 120. While in the conduction band 120, the electrons are free to move and they become carriers, and thus, an electrical current is formed. The minimal energy state of the conduction band 120 and the maximum energy state of the valence band 110 are each characterized by a crystal momentum. If these momenta are the same for the electrons and holes in both the conduction band and the valence band, the bandgap between the valence band and the conduction band is called a direct bandgap as an electron can jump directly (see arrow 116 in FIG. 1B) from the valence band to the conduction band without a change in the crystal momentum. This is helpful because a photon can bring energy to the electron, but cannot provide the momentum. Thus, for this type of material, the photoenergy carried by the photons can excite an electron from the valence band 110 to the conduction band 120 with no need to supply a momentum change. These materials are sensitive to visible and UV radiation.

However, if the material is an indirect bandgap semiconductor as illustrated in FIG. 1A, to excite the electron from the valence band 110 to the conduction band 120, there is necessary to have a photon that provides the necessary energy to do this jump, which is illustrated by arrow 112, but in addition, there is a need for a phonon that provides the momentum change, as illustrated by arrow 114. A phonon is a collective excitation in a period, elastic arrangement of atoms or molecules in condensed matter. A phonon makes the recombination of electrical carriers or the transition of one electrical carrier from one band to another much difficult in a given time period. This also means that the eventual recombination that will take place in an indirect bandgap material does not result in light being generated or absorbed, which is a source of noise for the X-ray devices, but rather the recombination is non-radiative, taking place at point defects or at grain boundaries in the crystals. These materials are thus substantially insensitive to visible or UV radiation.

Thus, the inventors have observed that by using a perovskite having good X-ray sensitivity, if selected to also have the indirect bandgap, it could essentially prevent visible and UV light interference because without the presence of the phonon, the electrical carriers from the valence band or conduction band cannot jump to the other of the valence and conduction bands, effectively suppressing the visible and UV radiation interference. That is the reason of why all the light-emitting and laser diodes are made of the direct bandgap materials, so that the electrical carriers can be recombined easily, without the need of a phonon, for generating the light.

Figure 2A:
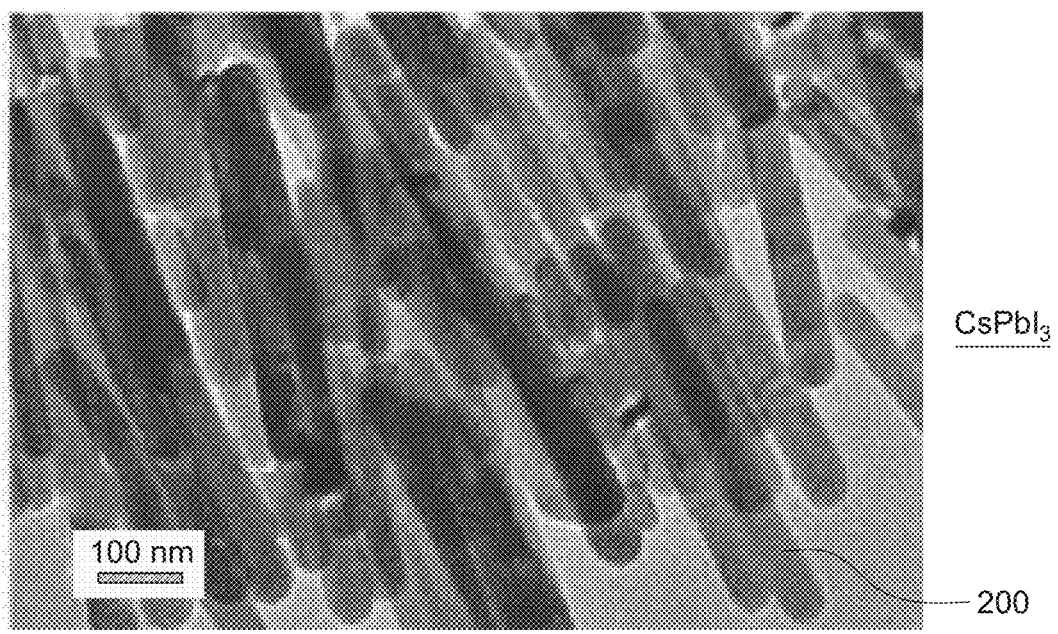
FIGS. 2A to 2D are transmission electron microscopy (TEM) images of four perovskite based semiconductor materials.
Figure 2B:
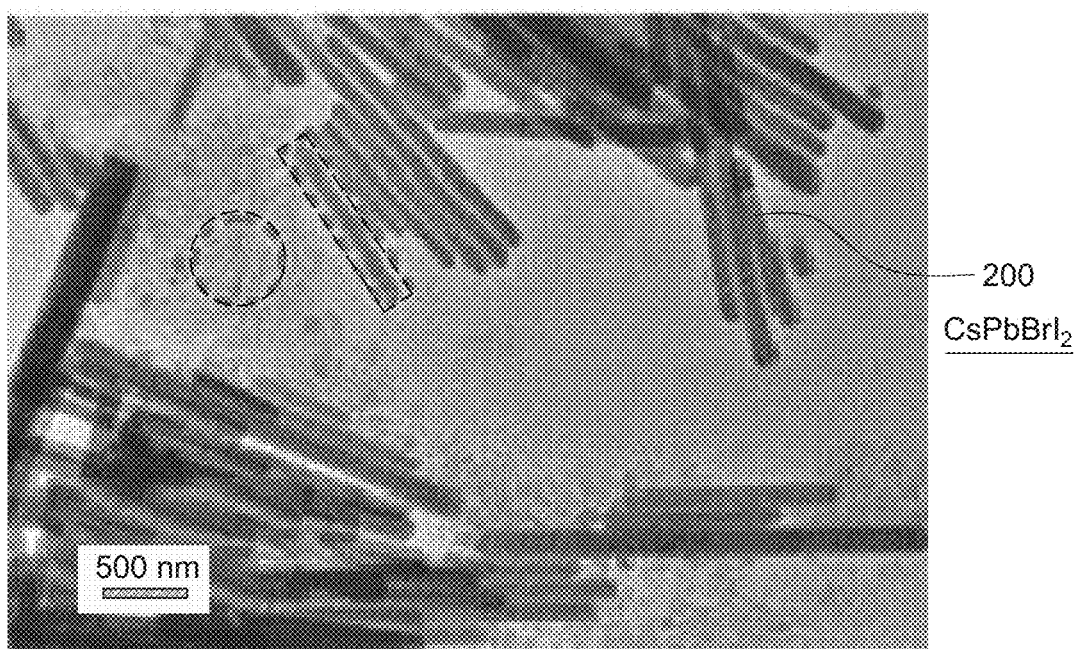
Figure 2C:
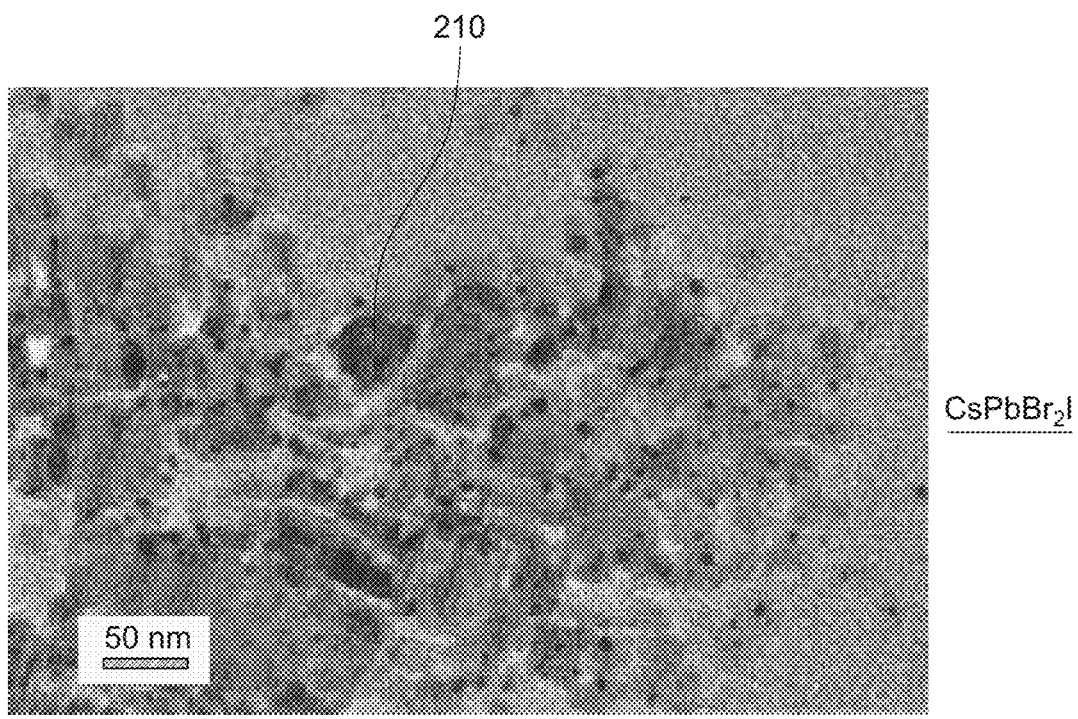
Figure 2D:
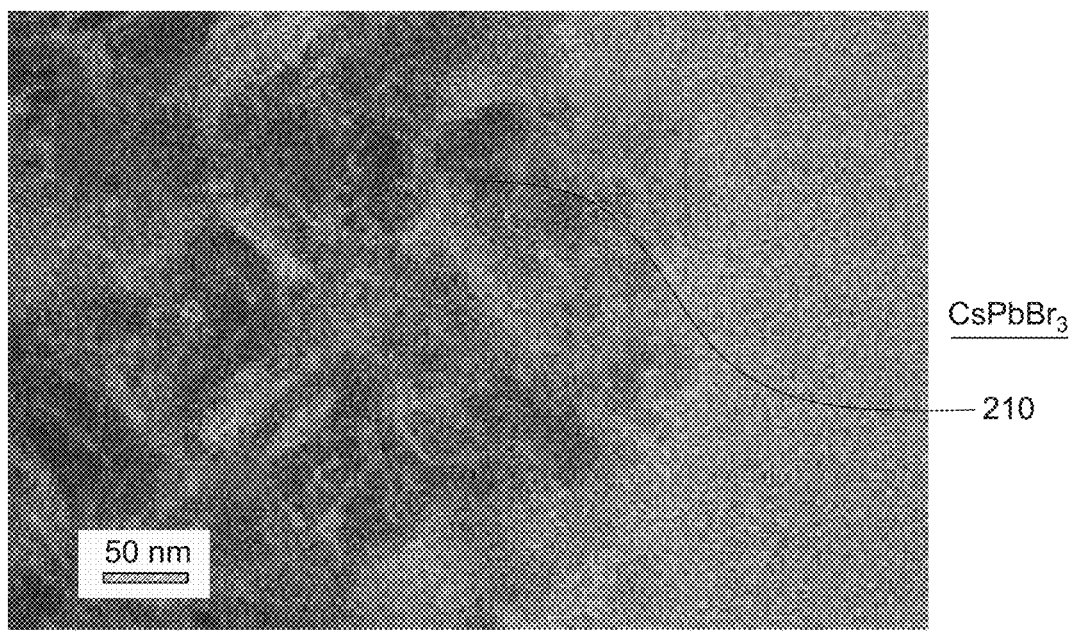

As shown in the high-resolution transmission electron microscopy (HRTEM) images presented in FIGS. 2A to 2D, the as-synthesized NCs with different X=Br/I ratios exhibit markedly different shapes depending on the weight of the halogen element. Generally, there are two types of $CsPbX_3$ NC morphology—nanorods 200 and nanosheets 210. The $CsPbI_3$ material forms nanorods of 10 nm diameter and 150-1,000 nm length, as shown in FIG. 2A. On the other hand, the $CsPbBr_3$ NCs form ultra-thin nanosheets (of 3-5 nm thickness), with much smaller xy-dimensions (a few tens of nanometers) compared to those produced by the $CsPbI_3$, thus creating two-dimensional (2D) structures, as shown in FIG. 2D. The dramatically different sizes of these two NC types is determined by the colloidal dispersion in solution, which ranges from weak ($CsPbI_3$) to strong ($CsPbBr_3$), as the Br/I ratio increases. The figures further show that the $CsPbI_3$ films are formed by nanorod stacking, whereas the $CsPbBr_3$ film surface is much smoother due to the inherent nanosheet structure, which is in line with recent findings [12]. The TEM images in FIGS. 2B and 2C of the mixed halogen ($CsPbBr_2I$ and $CsPbBrI_2$) perovskite reveal mixed structures of those two morphology types, i.e., both nanorods and nanosheets.

Figure 3:
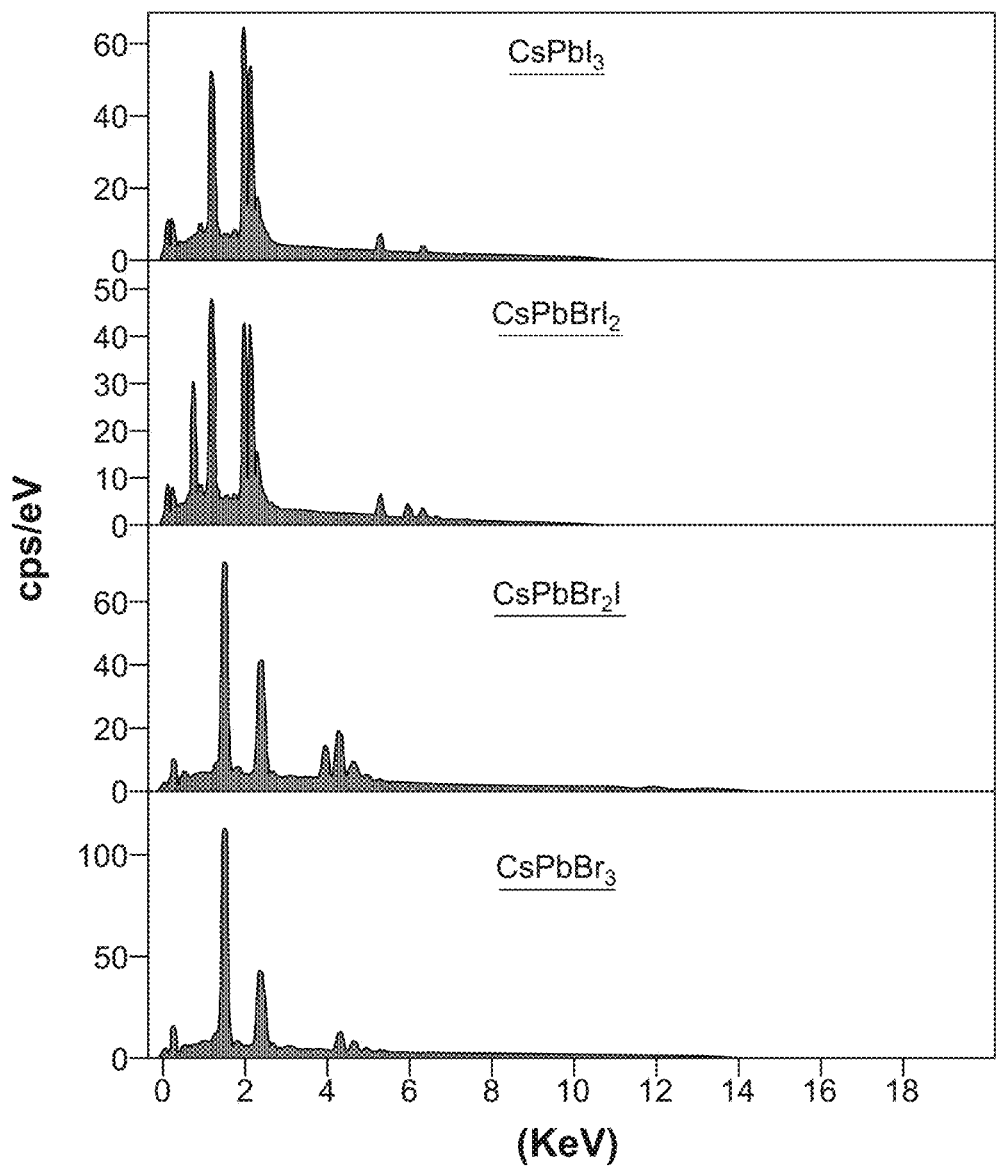
FIG. 3 illustrates EDX images for the four perovskite based semiconductor materials.

To determine the chemical composition contribution to the NC morphology, EDX measurements were carried out and the findings indicate that the Cs/Pb/Br/I elemental ratios are about 1:1:0:2.3, 1:1:1:1.5, 1:1:2.3:0.65 and 0.6:1:3:0, for the $CsPbI_3$, $CsPbBr_2I$, $CsPbBrI_2$, and $CsPbBr_3$ materials, respectively, as shown in FIG. 3. The reduced Cs ratio in the $CsPbBr_3$ sample is attributed to the fact that the Cs ion surface is replaced by a surfactant.

Figure 4:
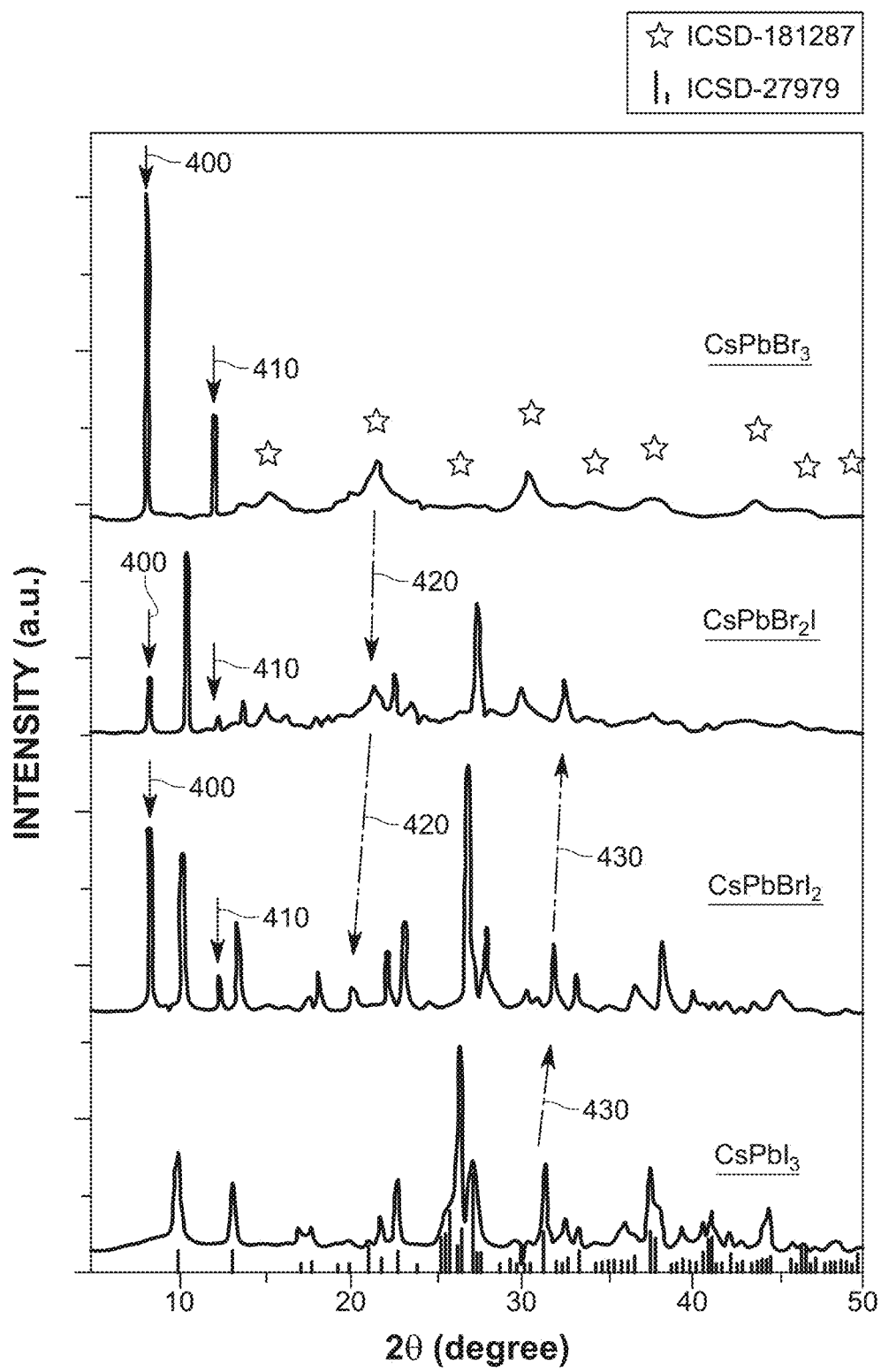
FIG. 4 illustrates the X-ray diffraction spectra for the four perovskite based semiconductor materials.

FIG. 4 shows the θ-2θ XRD scans of the four perovskite samples. Using the ICSD-181287 and ICSD-27979 XRD patterning, it can be determined that the $CsPbBr_3$ cubic phase belongs to the Pm-3m group and the $CsPbI_3$ orthorhombic δ-phase (non-perovskite yellow phase) belongs to the Pnma group, in line with the findings reported in literature. The peaks at 7.5° and 11.2° (indicated by reference numbers 400 and 410 in the figure) for the $CsPbBrI_2$, $CsPbBr_2I$ and $CsPbBr_3$ spectra are ascribed to the ordered stacking of the NCs or superstructures corresponding to the nanosheet morphology noted in the SEM images. However, it should be noted that both the $CsPbBrI_2$ and $CsPbBr_2I$ materials have mixed cubic and yellow phases. Moreover, their lattice constants can be increased by changing the I concentration, as confirmed by the slight shift of 21.5° and 31.5° peaks, which are indicated by the arrows 420 and 430, respectively, in FIG. 4.

Figure 5:
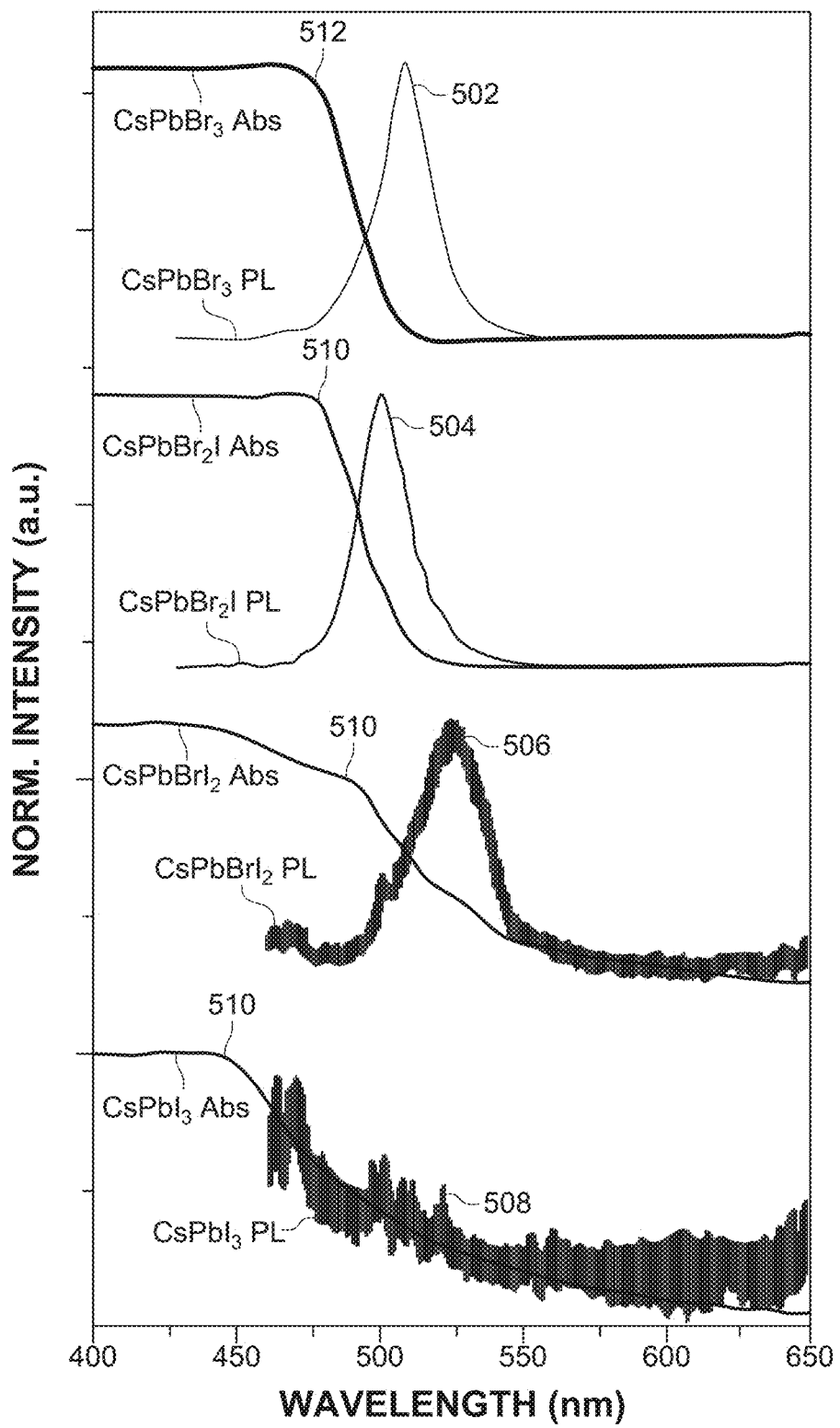
FIG. 5 illustrates the normalized photoluminescence (PL) and absorption (Abs) spectra of $CsPbX_3$ perovskite materials.

Due to the chemical phase differences among the four studied samples, the perovskite material exhibits markedly different optical properties, as shown in the normalized room temperature (RT) photoluminescence (PL) and absorption spectra illustrated in FIG. 5, which illustrates the normalized PL and Abs spectra of $CsPbX_3$. It is noted in the figure that the PL peaks 502 to 508 (excited by the 400 nm line) located within the 500-525 nm range exhibit a very slight shift as the I and Br composition changes. Thus, the usual color tuning observed for the $CsPbX_3$ material as a result of varying the halogen element composition ratio is not observed in the materials. A redshift from the absorption edge is observed for emission peaks of all materials, which is indicative of the Stokes-shift. By integrating the un-normalized PL spectrum, the 3:17:100:2000 intensity ratio is obtained for the $CsPbI_3$: $CsPbBrI_2$:$CsPbBr_2I$:$CsPbBr_3$ emission peaks, indicating significant emission decline as the I composition increases.

As the I composition in the perovskite samples increases, the absorption edge 510 becomes very broad, while the $CsPbBr_3$ material produces a much sharper absorption edge 512 accompanied a higher-intensity PL peak 502, indicating that the dominance of the radiative recombination processes increases as the I contribution decreases, i.e., visible and UV light interference is suppressed as the material becomes more of an indirect bandgap material.

Figure 6:
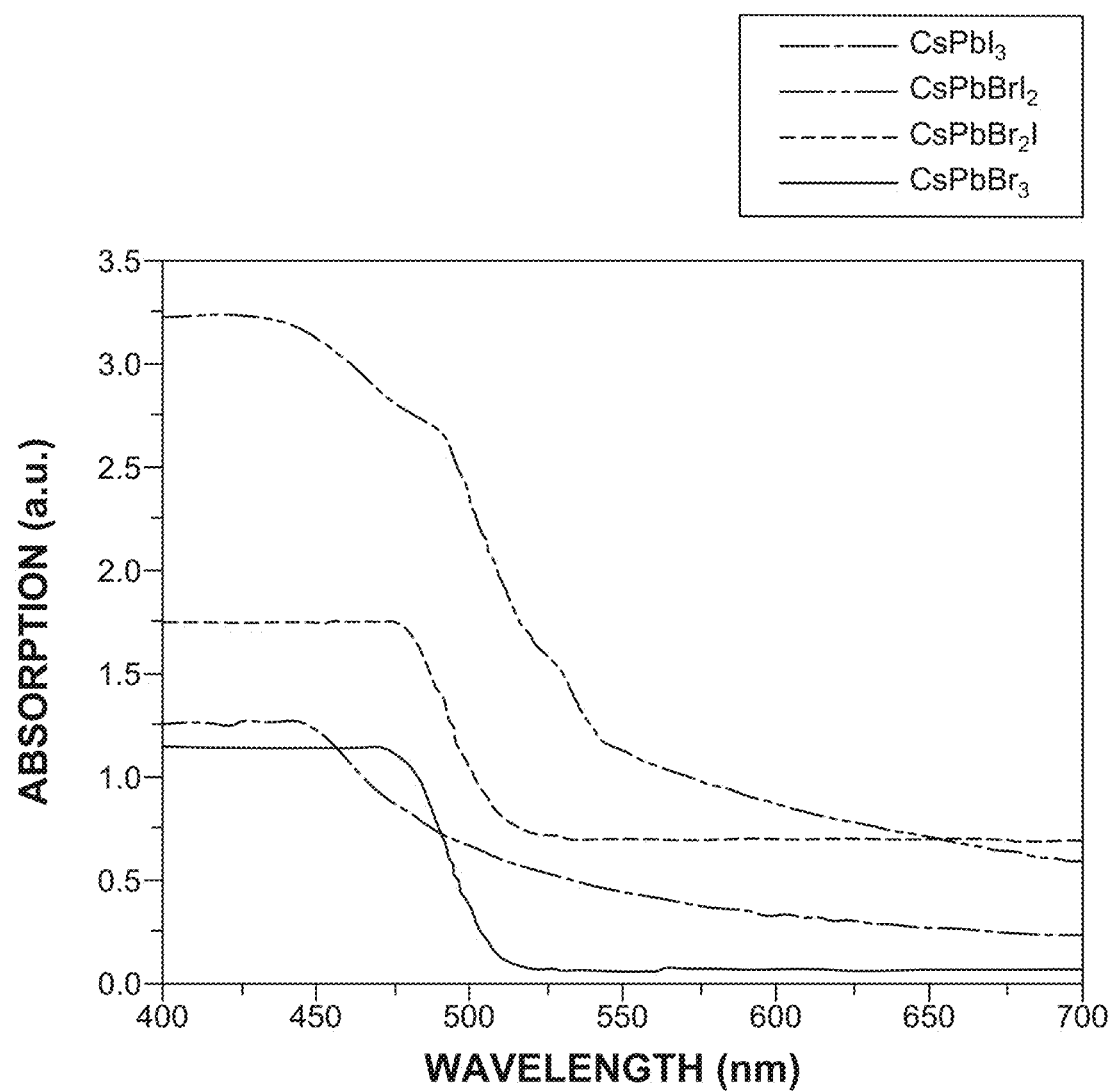
FIG. 6 illustrates the Abs spectra for the four perovskite based semiconductor materials.

This means that under UV light illumination, the color brightness of the material declines sharply, from significantly bright ($CsPbBr_3$) to completely dark (no emission from $CsPbI_3$), as the I concentration increases. On the other hand, the material color becomes either yellow- or orange- under room light, corresponding to the absorption spectra shown in FIG. 6.

Figure 7A:
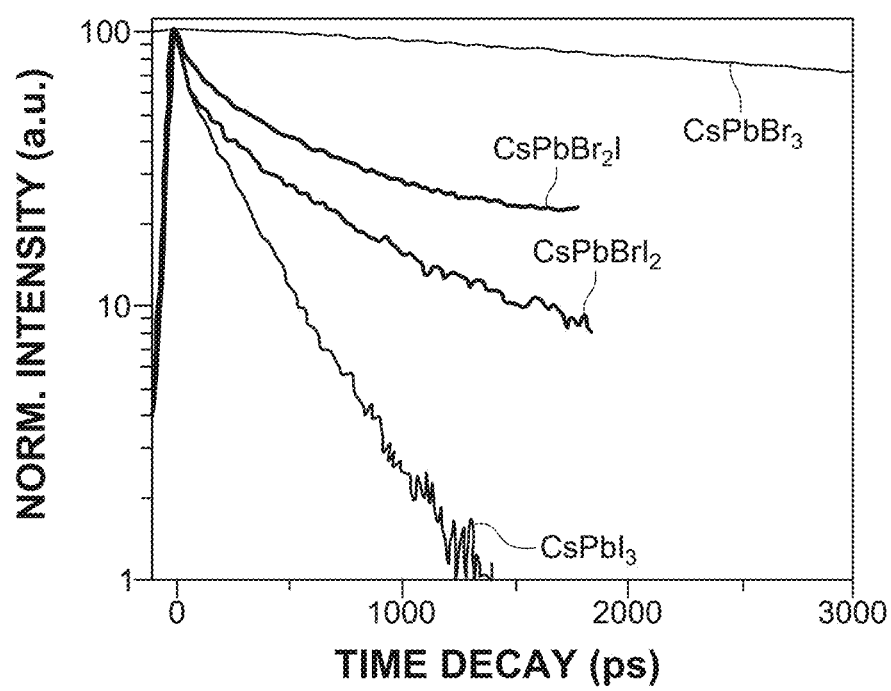
FIG. 7A shows the time-resolved photoluminescence (TRPL) spectrum for the four perovskite based semiconductor materials and FIG. 7B shows the lifetime parameters of the four perovskite based semiconductor materials.
Figure 7B:
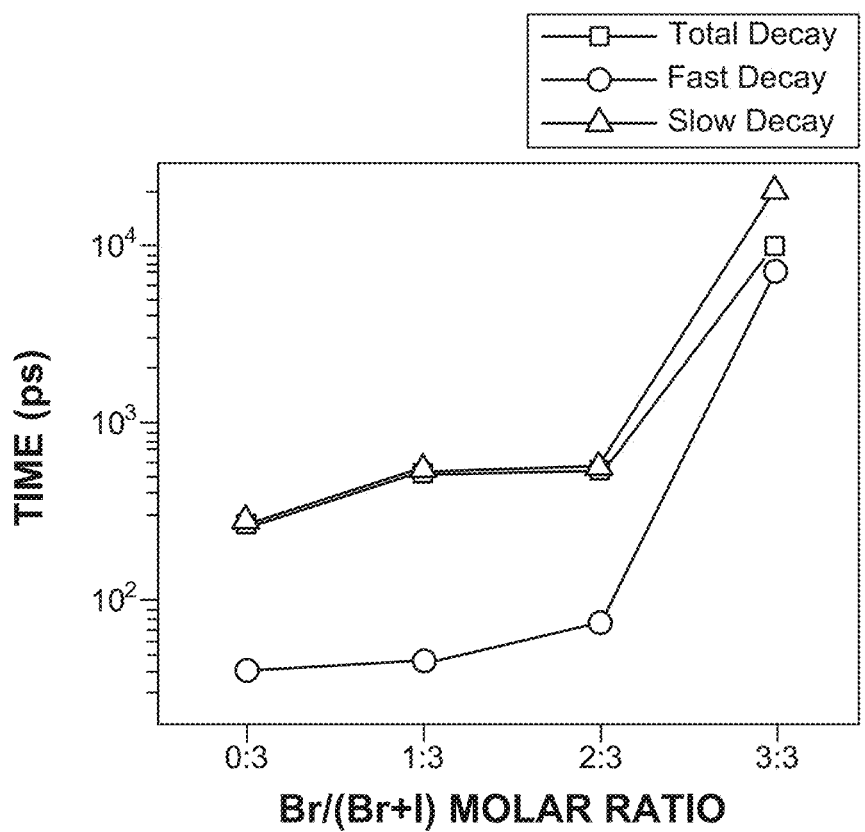

Time-resolved photoluminescence (TRPL) measurements of the $CsPbX_3$ materials are shown in FIG. 7A and they indicate that the lifetime of the light intensity declines as the I composition increases, which is desired for an X-ray sensor material. The curves in FIG. 7A were fitted with bi-exponential decay functions and the total lifetime (comprising of both fast and slow decay) is plotted in FIG. 7B. It is worth noting that the total lifetime of the $CsPbI_3$, $CsPbBrI_2$ and $CsPbBr_2I$ materials is dominated by the slow decay component, which makes them good candidates for an X-ray sensor. On the other hand, the total lifetime for the $CsPbBr_3$ material is determined by both the slow and fast components, which makes this material undesirable for the X-ray sensor. It is observed that both slow lifetimes of the $CsPbBr_3$ material ($\tau=9.7\times10^3\sim10^4$ ps) are almost two orders of magnitude greater than those of the other compounds incorporating I (264.6 ps, 511.5 ps, and 525.9 ps for $CsPbI_3$, $CsPbBrI_2$ and $CsPbBr_2I$, respectively), which indicate the suitability of the $CsPbI_3$, $CsPbBrI_2$ and $CsPbBr_2I$ materials for reducing the visible and UV light interference.

Figure 8A:
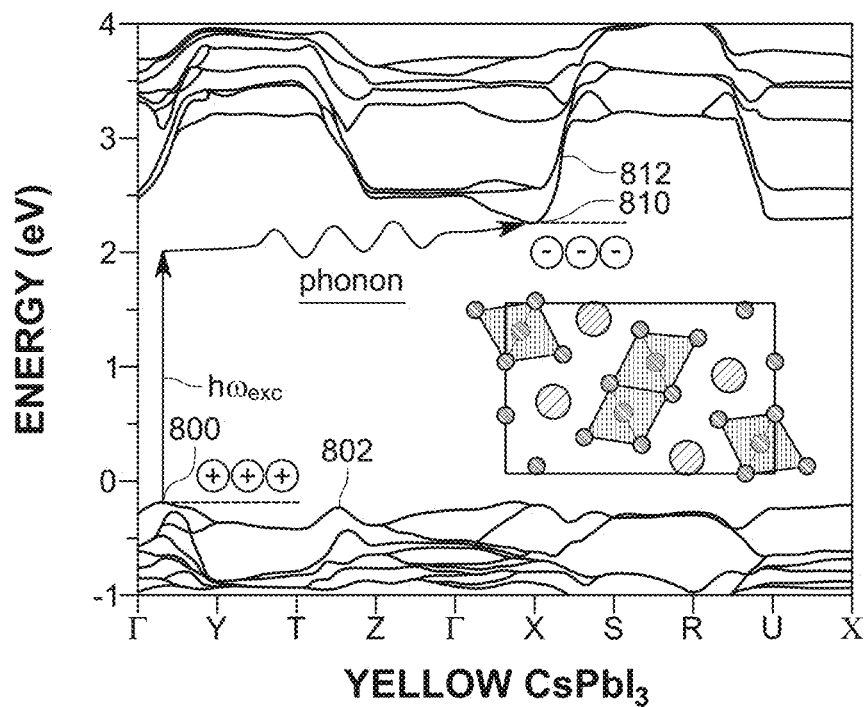
FIGS. 8A and 8B show the energy band structure for the yellow phase $CsPbI_3$ and cubic $CsPbBr_3$ perovskite materials.
Figure 8B:
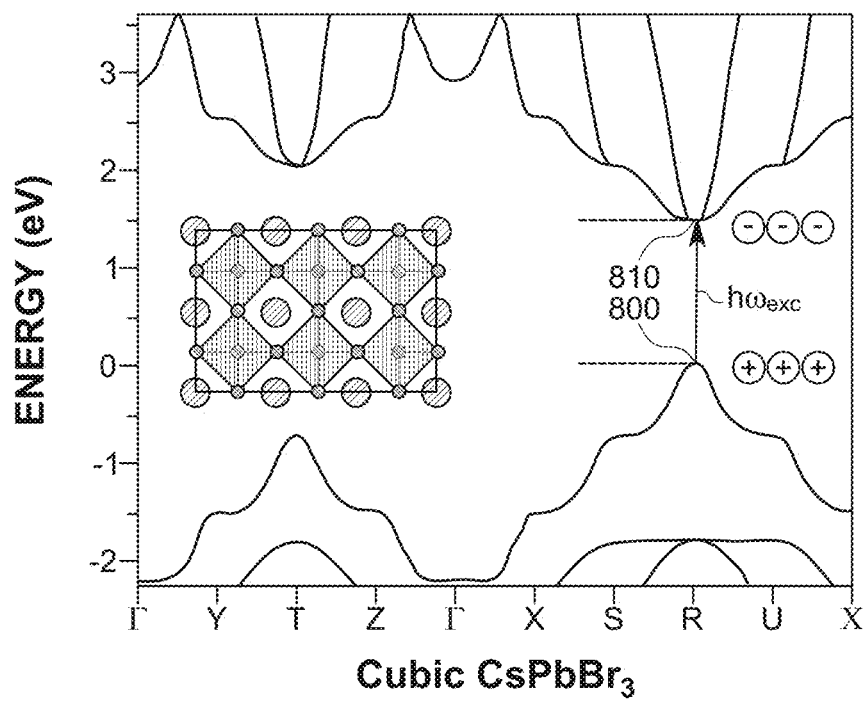

To understand the change in the optical properties and the related carrier dynamics of the perovskite materials discussed above, which result from an increase in the Br/I ratio, the ab initio electronic structure calculations of orthorhombic δ-$CsPbI_3$ (yellow phase), see FIG. 8A, cubic $CsPbBr_3$, see FIG. 8B, orthorhombic γ-$CsPbI_3$ (black phase), and cubic $CsPbI_3$ were performed by applying the density functional theory (DFT). As can be seen from the band structure of the yellow phase $CsPbI_3$ shown in FIG. 8A, the valence band 802 maximum (VBM) 800 is situated between the highly symmetric Brillouin zone Γ and Y k-points, while the conduction band 812 minimum (CBM) 810 is located at a different point (X k-point). The fact that the maximum 800 and minimum 810 are separated by a k-point momentum (which requires a phonon to provide this momentum), as discussed above with regard to FIG. 1A, indicates that the yellow phase $CsPbI_3$ material shown in FIG. 8A is an indirect bandgap semiconductor. The structure of the $CsPbI_3$ material is shown as an insert in FIG. 8A. However, the cubic $CsPbBr_3$ material illustrated in FIG. 8B exhibits a direct bandgap as both the CBM 810 and the VBM 800 are located at the same R k-point (i.e., no momentum difference, as in FIG. 1B). The structure of the $CsPbBr_3$ material is shown as an insert in FIG. 8B. Unlike the yellow $CsPbI_3$, the γ-$CsPbI_3$ and the cubic $CsPbI_3$ exhibit direct bandgap nature, similar to $CsPbBr_3$. However, both the CBM and VBM of the γ-$CsPbI_3$ occur at the Γ point.

Figure 9A:
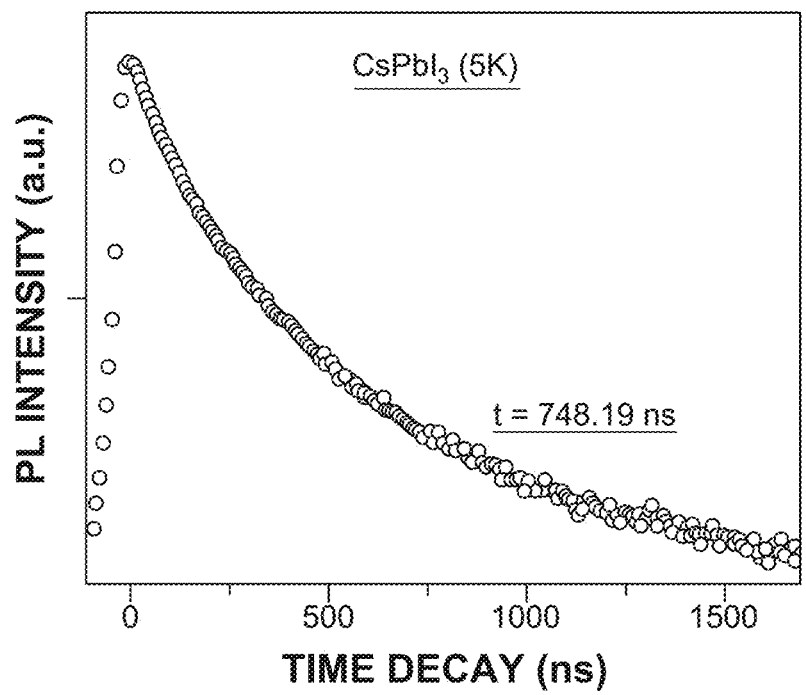
FIGS. 9A and 9B illustrate the low temperature TRPL spectrum for the yellow phase $CsPbI_3$ and cubic $CsPbBr_3$ perovskite materials.
Figure 9B:
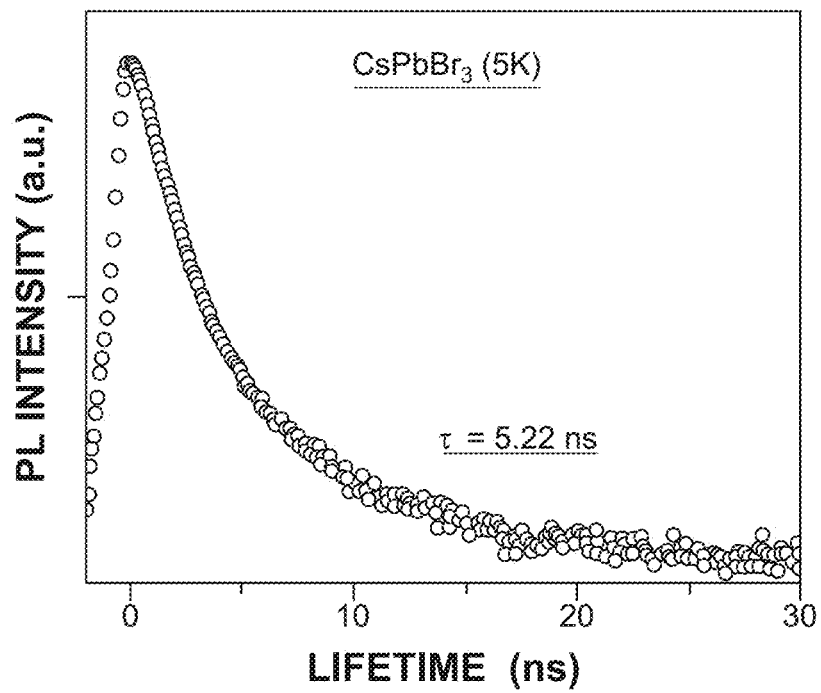

The TRPL measurements for the yellow phase $CsPbI_3$ and the cubic $CsPbBr_3$ are illustrated in FIGS. 9A and 9B, respectively. At 5K temperature, the $CsPbI_3$ lifetime increases significantly to 748.2 ns (ps range), see FIG. 9A, compared to that (264.6 ps) at RT. On the other hand, almost no significant change in the lifetime of the $CsPbBr_3$ material (5.2 ns) is observed as the temperature decreases from RT to 5 K, as shown in FIG. 9B. Such behavior is common in indirect and direct bandgap materials, respectively. Normally, at low temperatures, the recombination lifetime is considerably slower in indirect bandgap materials than in direct bandgap ones as the phonon interaction in indirect bandgap material is involved in the carrier excitation/recombination process for momentum conservation (as discussed above with regard to FIGS. 1A and 1B) to transfer the carriers from the CB at X k-point to VB at k-point between Γ and Y, as shown in the band structures of the $CsPbI_3$ material in FIG. 9A. Thus, this explains the broadening of the absorption edge and low emission produced by the $CsPbI_3$ sample. On the other hand, in direct bandgap materials, the carrier excitation/recombination process from/to VBM occurs at the same k-point, as shown in the $CsPbBr_3$ band structure in FIG. 8B, resulting in dominant radiative electron-hole recombination R k-point as no phonon interactions are involved, which explains the sharp absorption edge and high and sharp PL intensity.

In this regard, the indirect bandgap materials are not suitable for optoelectronic applications because the electron and hole separation requires not only photon involvement, but also necessitates momentum conservation via a phonon, which significantly reduces the probability of photoelectric conversion. However, as discussed above, this feature of the indirect bandgap materials is advantageous for an X-ray detector as for this type of sensor there is a desire to suppress the photoelectric conversion.

Figure 10A:
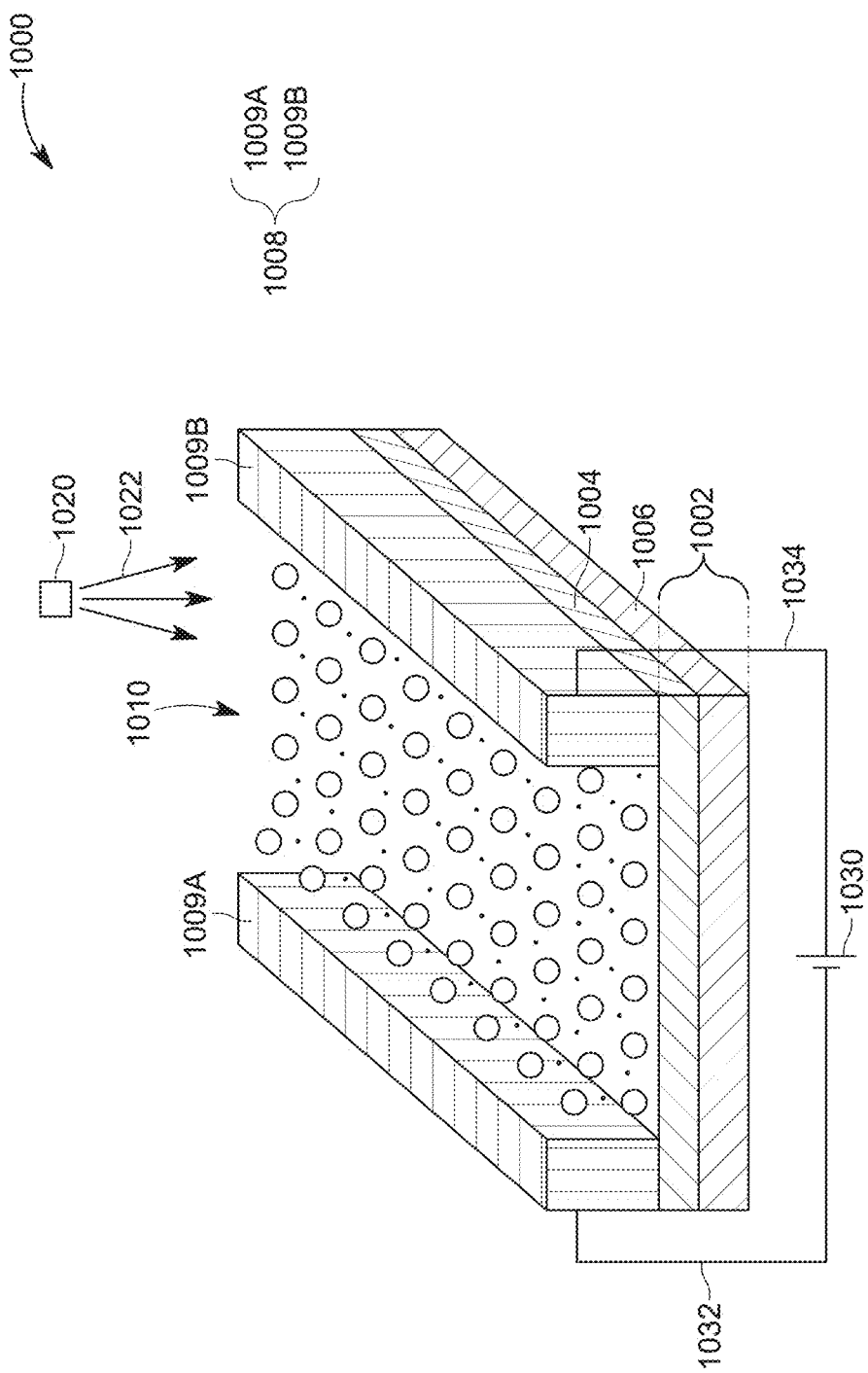
FIGS. 10A and 10B illustrate an X-ray sensor that uses an indirect bandgap, perovskite semiconductor material.

The four perovskite samples discussed above were prepared by drop casting 100 ml of a colloid solution on an interdigitated contact electrode (IDE) formed on a substrate, to form an X-ray sensor 1000. FIG. 10A shows the X-ray sensor 1000 having a substrate 1002, for example, including a $SiO_2$ layer 1004 formed on top of a Si layer 1006, the IDE 1008 having two trunks 1009A and 1009B (more trunks are possible), for example, made of Pt to act as an ohmic contact in the horizontal metal-semiconductor-metal (MSM) structure shown in FIG. 10A. The perovskite material 1010 was formed between the IDE trunks 1009A and 1009B. The active layer 1010 was exposed to a light 1022 from a light source 1020 (the light 1022 was visible light, UV light and X-ray radiation in the various experiments), which generates carriers, enhancing a current derived by a bias voltage applied to the two electrodes by a power (e.g., voltage) source 1030. Two leads 1032 and 1034 are connecting the trunks 1009A and 10096 to the power source 1030.

Figure 10B:
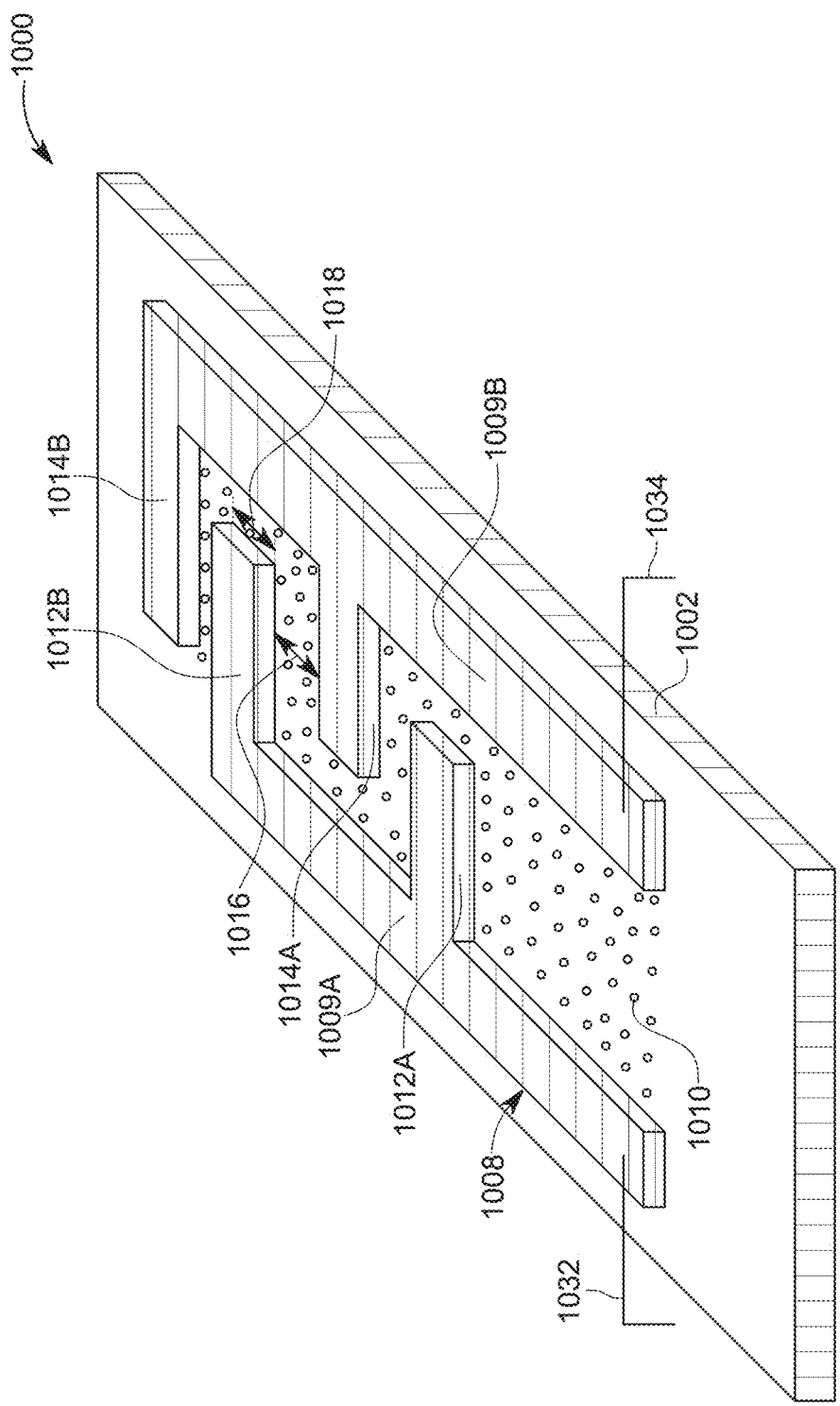

In one application, an 80 nm thick electrode 1008 was deposited on the $SiO_2$/Si substrates 1004/1006 of 200 nm thickness by thermal evaporation assisted with shadow masks. The interdigitated contact electrode (ICE) 1008 includes four close parallel branches 1012A, 1012B, 1014A, and 1014B extending from two separate trunks 1009A and 1009B, as shown in FIG. 10B. The channel length 1016 between the branches and the branch width 1018 was 30 μm and 950 μm, respectively. Other values for these dimensions may be used. The $CsPbX_3$ solution was drop casted on the electrode. After the solution had dried, the sample was placed on a hot plate for thermal annealing in ambient air at 110° C. for 10 minutes. Other values for these parameters may be used.

Figure 11A:
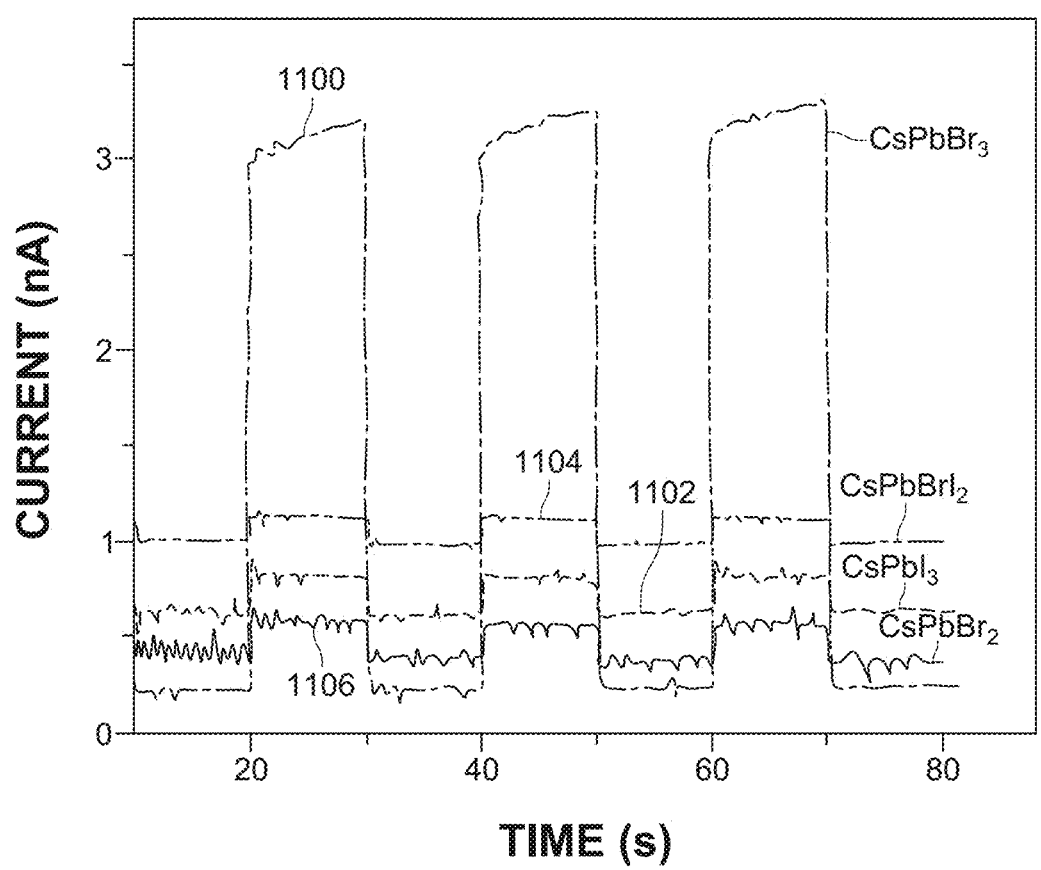
FIG. 11A illustrates the on-off performance of the four perovskite based semiconductor materials under visible light noise and FIG. 11B illustrates the on-off performance of the four perovskite based semiconductor materials under UV light noise.
Figure 11B:
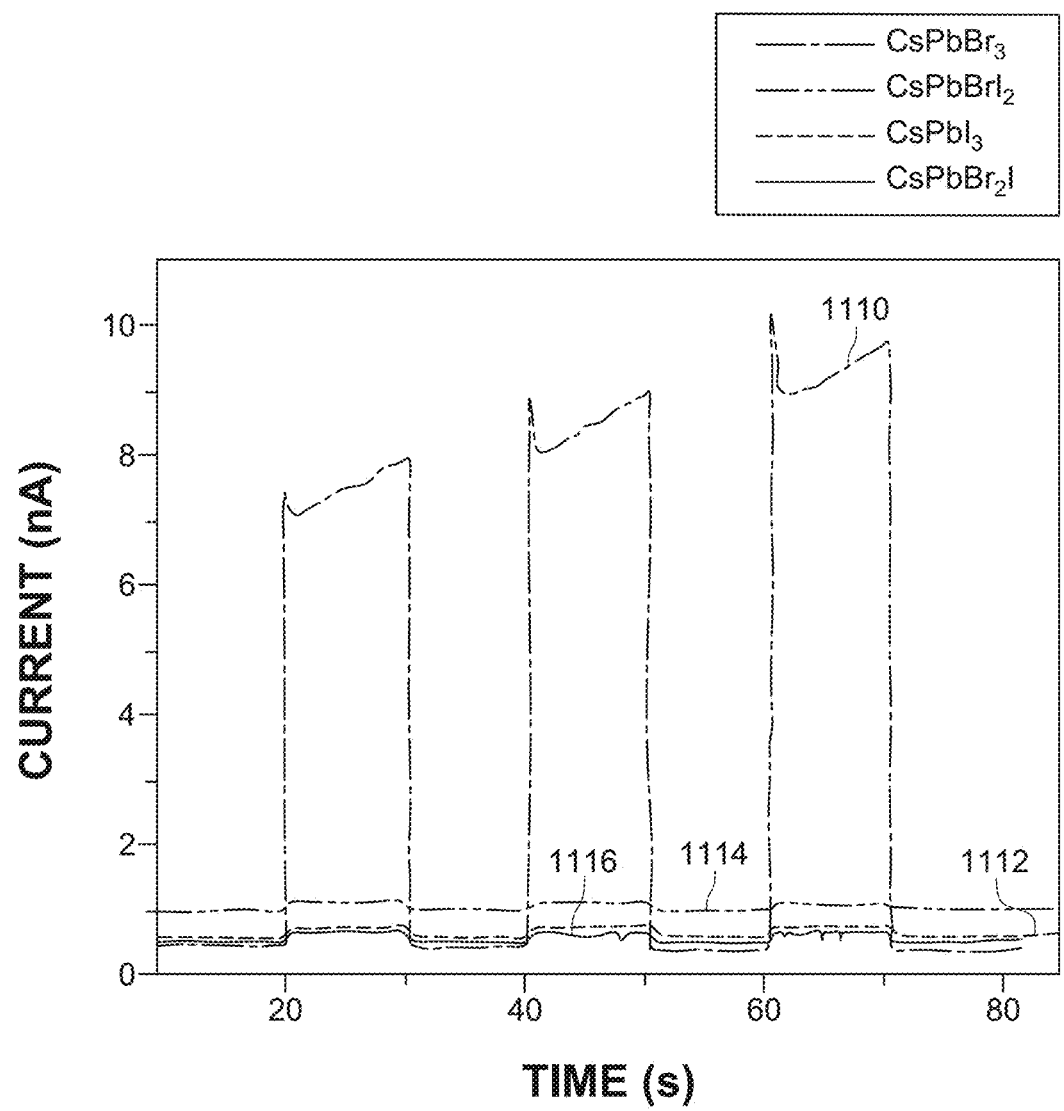

FIG. 11A shows the on-off current curve obtained when the active material 1010 was exposed to visible light, while FIG. 11B shows the on-off current curve when the active material 1010 was exposed to UV radiation at 5 V bias voltage. The visible light was produced by a 400 nm~700 nm, 53 mW/cm² white LED, whereas a 244 nm, 158.5 mW/cm² UV laser served as the UV light source. The $CsPbBr_3$ material produced a photocurrent of 3 nA under visible light, see curve 1100 in FIG. 11A, and 8.3 nA under UV light, see curve 1110 in FIG. 11B. The other three perovskite samples containing iodine (PCI), i.e., CsPbI$_3$, CsPbBrI$_2$, and CsPbBr$_2$I, yielded a much lower photocurrent, i.e., 0.2 nA (see curve 1102), 0.16 nA (see curve 1104), and 0.18 nA (see curve 1106), respectively, which is about ~7% of the photocurrent obtained for the CsPbBr$_3$ material under visible light. The currents generated by these three perovskite materials under UV illumination are similarly small, as shown in FIG. 11B, which indicates a current of 0.22 nA (curve 1112 for CsPbI$_3$), 0.1 nA (curve 1114 for CsPbBrI$_2$), and 0.14 nA (curve 1116 for CsPbBr$_2$I), which is about ~2.5% of the current value measured for the CsPbBr$_3$ material. The I-V curves of the PCI samples shown in FIGS. 11A and 11B indicate that their response almost coincides under visible/UV excitation and in dark conditions, which implies highly unfavorable response under visible/UV light conditions. The degeneration in the studied PCI devices when exposed to visible/UV light illumination is due to the indirect band structure of these PCI materials. The poor response of the PCI samples and the favorable response of CsPbBr$_3$ is believed to be to the fact that, unlike the former, the latter is a direct bandgap material, characterized by higher generated carrier density due to direct carrier transitions from VB to CB bands discussed in FIGS. 1A and 1B. Conversely, in indirect bandgap materials, for the carrier transitions after absorbing the light, the absorbed energy is dissipated through the phonon interactions, leading to poor device response to illuminated light. These characteristics of the indirect bandgap semiconductor materials make them ideal candidates for the active material for an X-ray sensor.

Figure 12A:
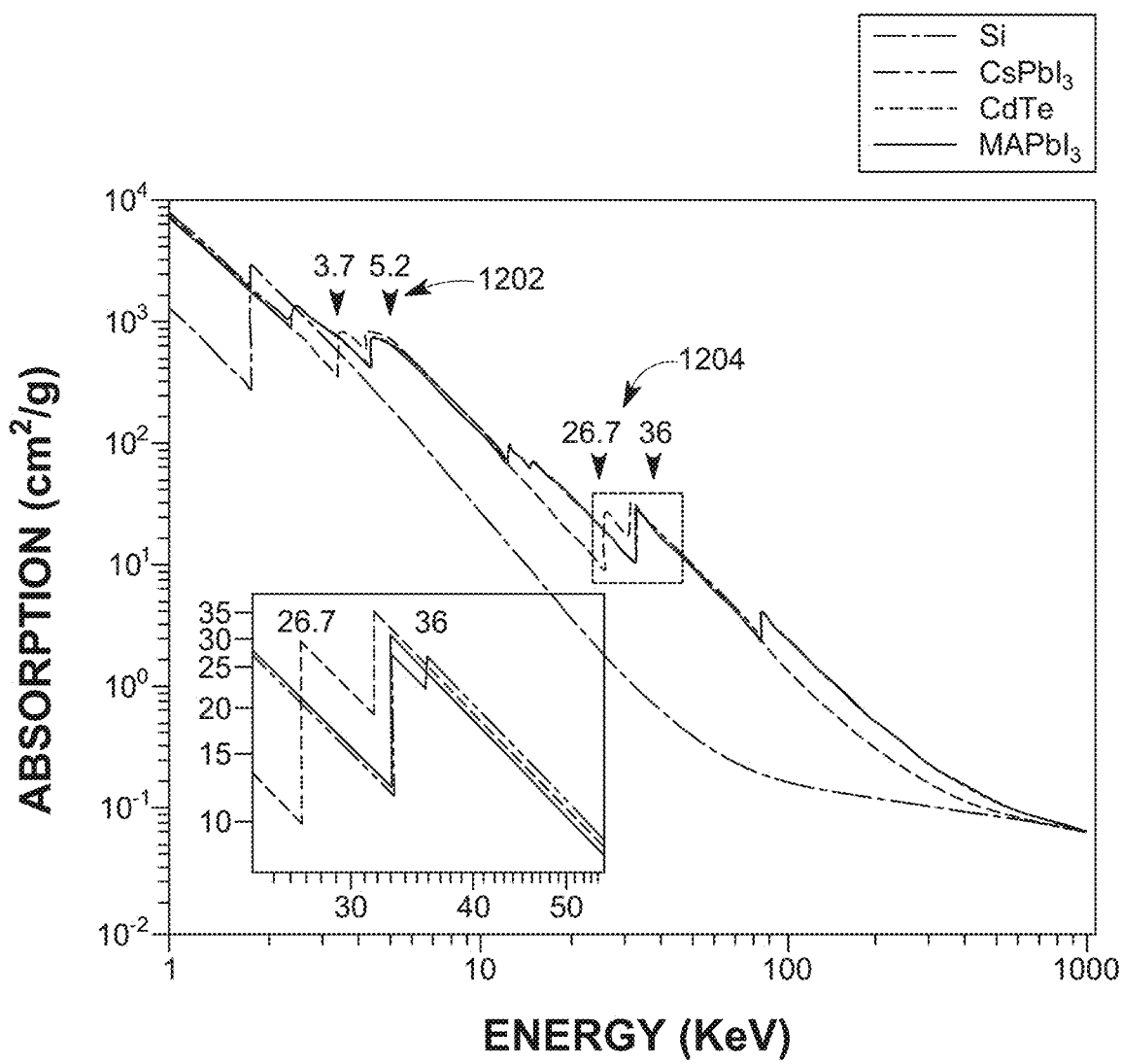
FIG. 12A illustrates the mass absorption of Si, CdTe, $MAPbI_3$, and $CsPbI_3$ as a function of the X-ray energy.
Figure 12B:
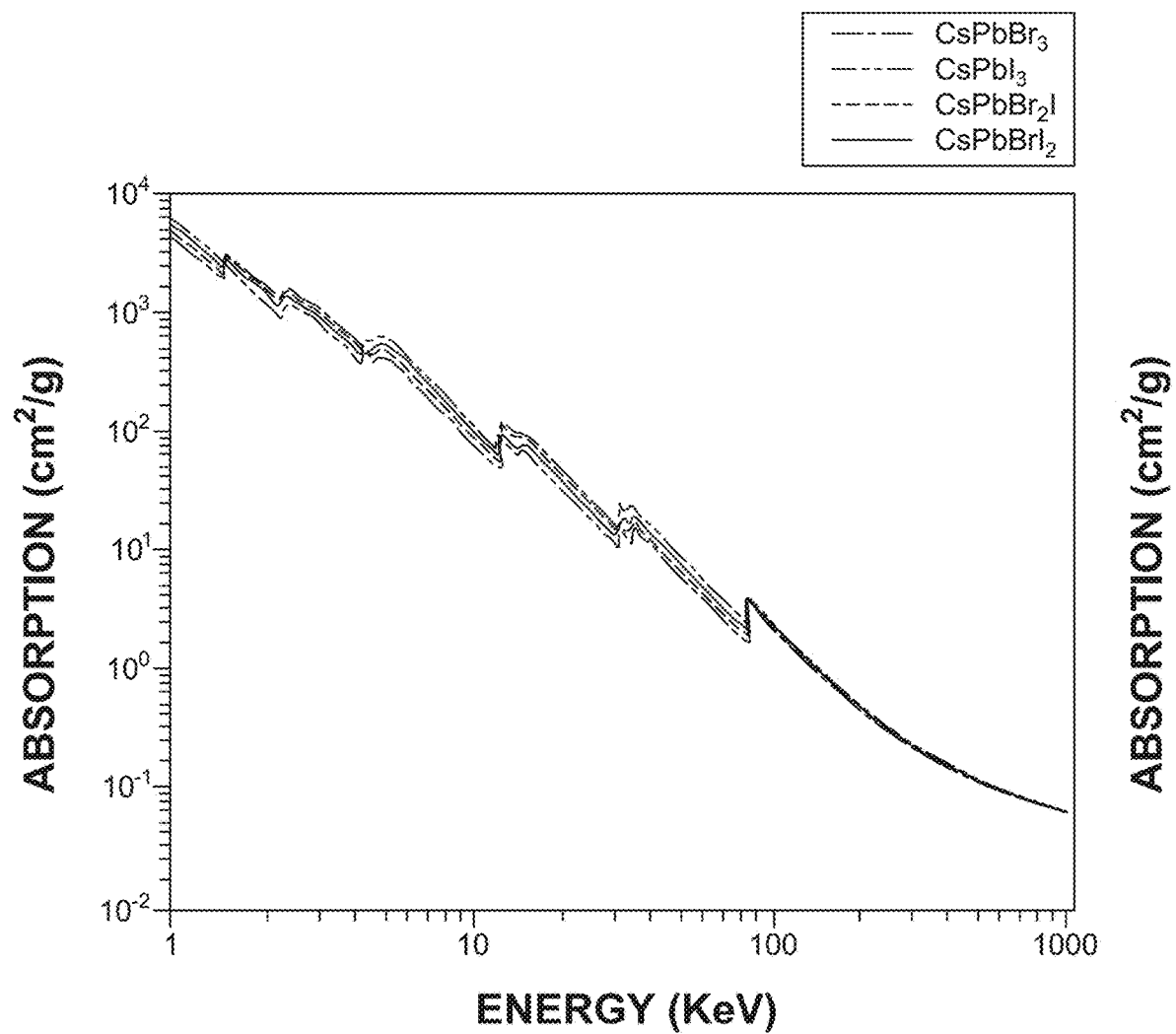
FIG. 12B illustrates the absorption coefficient for the four perovskite based semiconductor materials.

The CsPbI$_3$ material's X-ray absorption spectrum was compared to that of traditional semiconductors over a broad range of photon energies using the photon cross-section database, as shown in FIG. 12A. The rest of the CsPbX$_3$ materials have similar absorption as the CsPbI$_3$ material, as shown in FIG. 12B. The X-ray absorption coefficient is determined by the equation $\alpha=Z^4/E^3$, where Z is the atomic number and E is the radiation energy. As elements Cs, Pb, I and Br are heavy elements, this results in an efficient X-ray attenuation and improved signal current as the X-ray radiation is readily absorbed by the material in the X-ray path. For example, the CsPbI$_3$ absorption coefficient across the entire energy region (excluding the 3.7-5.2 kV range 1202 and the 26.7-36 kV range 1204 in FIG. 12A) is slightly higher than that of CdTe (see the inset of FIG. 12A). This performance is also superior to that reported for inorganic perovskite MAPbI$_3$ and is much better than the performance of traditional Si-based detectors.

Figure 12C:
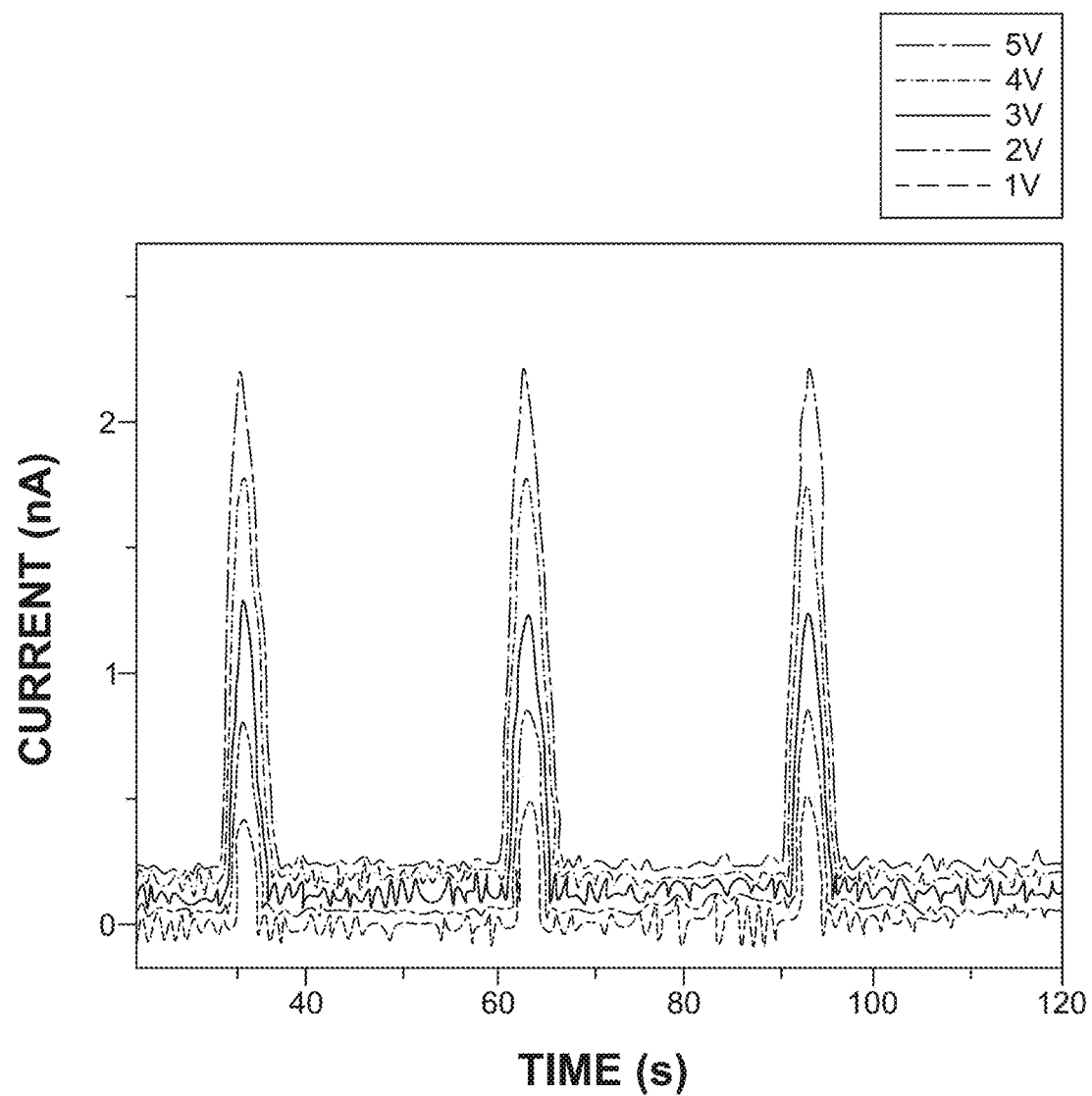
FIG. 12C illustrates the I-T curve of a $CsPbBrI_2$ detector at different voltages when subjected to a 60 KV, 200 mA, 2 s X-ray pulse.

The performance of X-ray detectors based on the four studied perovskites was investigated using a dark environment clinical diagnosis tube. Only the I-T curve of the CsPbBrI$_2$ material under different bias voltages is shown in FIG. 12C, as the other three samples produced a similar response. The repeated on/off current cycles are characterized by the same intensity and are capable of reversible and rapid switching between the dark and the X-ray illuminated state, indicating a stable device performance. However, the on-current exhibited much greater fluctuations than the device performance under visible light or UV light. Such fluctuations could be attributed to the ripple of the X-ray tube or the random carrier generation in the perovskite active layer.

Figure 12D:
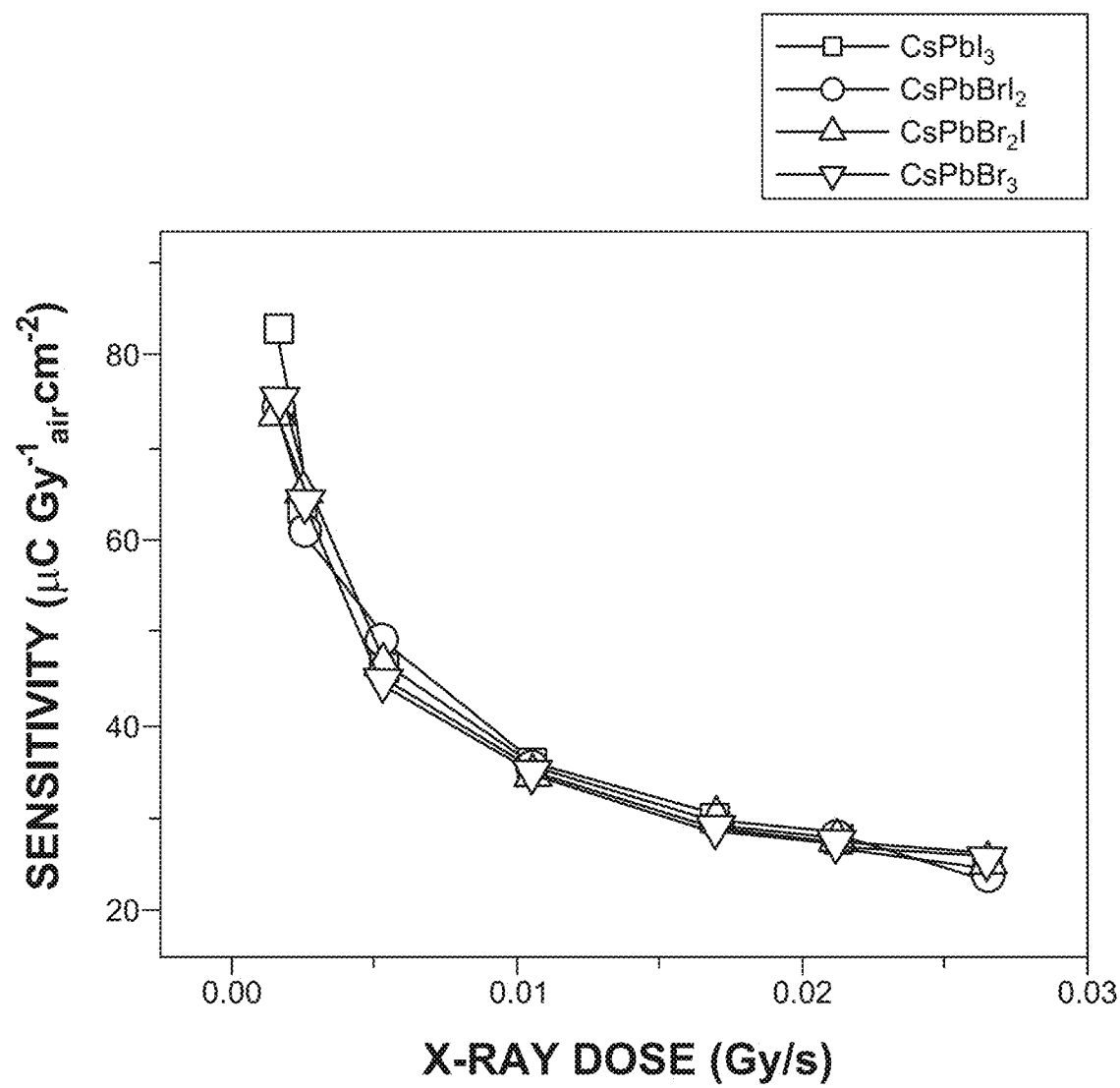
FIG. 12D illustrates the sensitivity as a function of X-ray dose for the four perovskite based semiconductor materials.

By using the S=Q/AX sensitivity formula, where A is the exposure area and X is the radiation exposure, it can be shown that the sensitivity of the four perovskite samples follow a similar trend when dose-dependence experiments were conducted by varying the X-ray tube current, as shown in FIG. 12D. The sensitivity of the four perovskites increased with the dose rate reduction. The highest sensitivity (up to 83.6 $\mu CGy_{air}^{-1}$ cm$^{-2}$) was obtained for the CsPbI$_3$ sample (indirect bandgap sample) under 1.7 $mGy_{air}s^{-1}$ at an electron field of 0.17 V$\mu m^{-1}$.

Figure 12E:
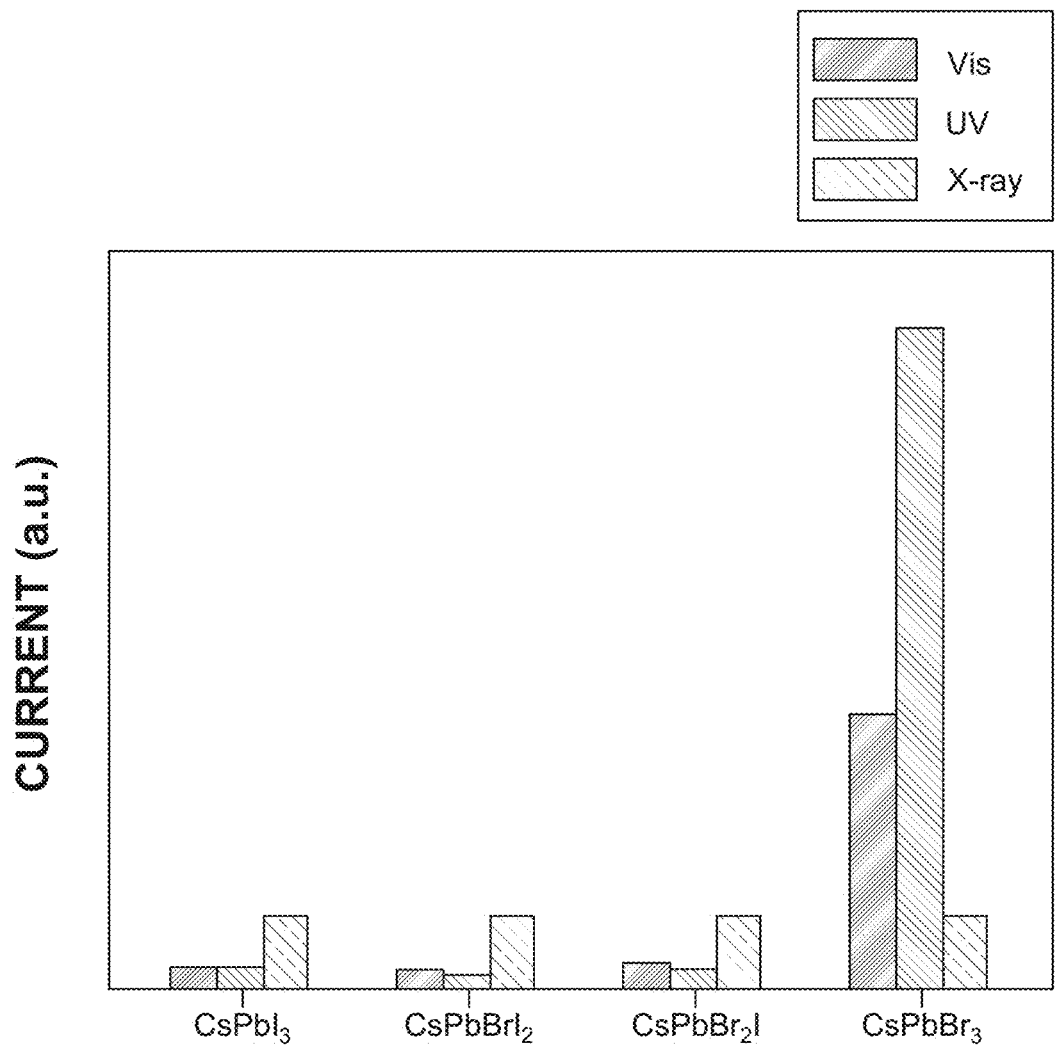
FIG. 12E illustrates the signal intensity produced by the four perovskite based semiconductor materials when excited by visible light (53 $mWcm^{-2}$), UV light (158.5 $mWcm^{-2}$) and X-ray radiation (26.5 $mGy_{air}S^{-1}$), respectively.

Compared to the response suppression under visible/UV light exposure, the PCI devices examined in these embodiments yielded a much higher response under X-ray radiation compared to the CsPbBr$_3$ material because conversion of the X-ray energy to a current does not depend on the material bandgap, in contrast to the UV/white light photodetectors. This is so because when X-rays are incident on the active atoms, the incoming photons eject electrons from inner orbitals (the L or K shell). The ejected electrons become free electrons or may be captured by other atoms. The resulting holes will be filled by electrons from an outer shell (M shell), each creating a hole that would act as a carrier. Normally, a perovskite material has a highly sensitive response to UV/visible light. However, the UV/visible light will produce noise in the X-ray detectors. The statistics related to CsPbI$_3$, CsPbBrI$_2$, CsPbBr$_2$I, and CsPbBr$_3$ under visible light (53 mWcm$^{-2}$) and UV light (158.5 mWcm$^{-2}$), as well as under X-ray radiation (26.5 $mGy_{air}S^{-1}$) shown in FIG. 12E, indicate that the four devices produce roughly similar X-ray responses.

However, this figure shows that the CsPbBr$_3$ visible/UV light current signal is much higher than that obtained under X-ray exposure. The visible/UV light current signal for the remaining three samples is markedly suppressed. Hence, the X-sensor using the remaining three perovskite materials could work under a very high light exposure without any further modification to their structure or additional signal modulation or layers for filtering out or stopping the visible and/or UV light. In other words, the indirect bandgap, perovskite semiconductor material is substantially insensitive to the visible or UV light, where the term "substantially" is understood herein to mean as less than 50% of the X-ray sensitivity of the same material.

Figure 13:
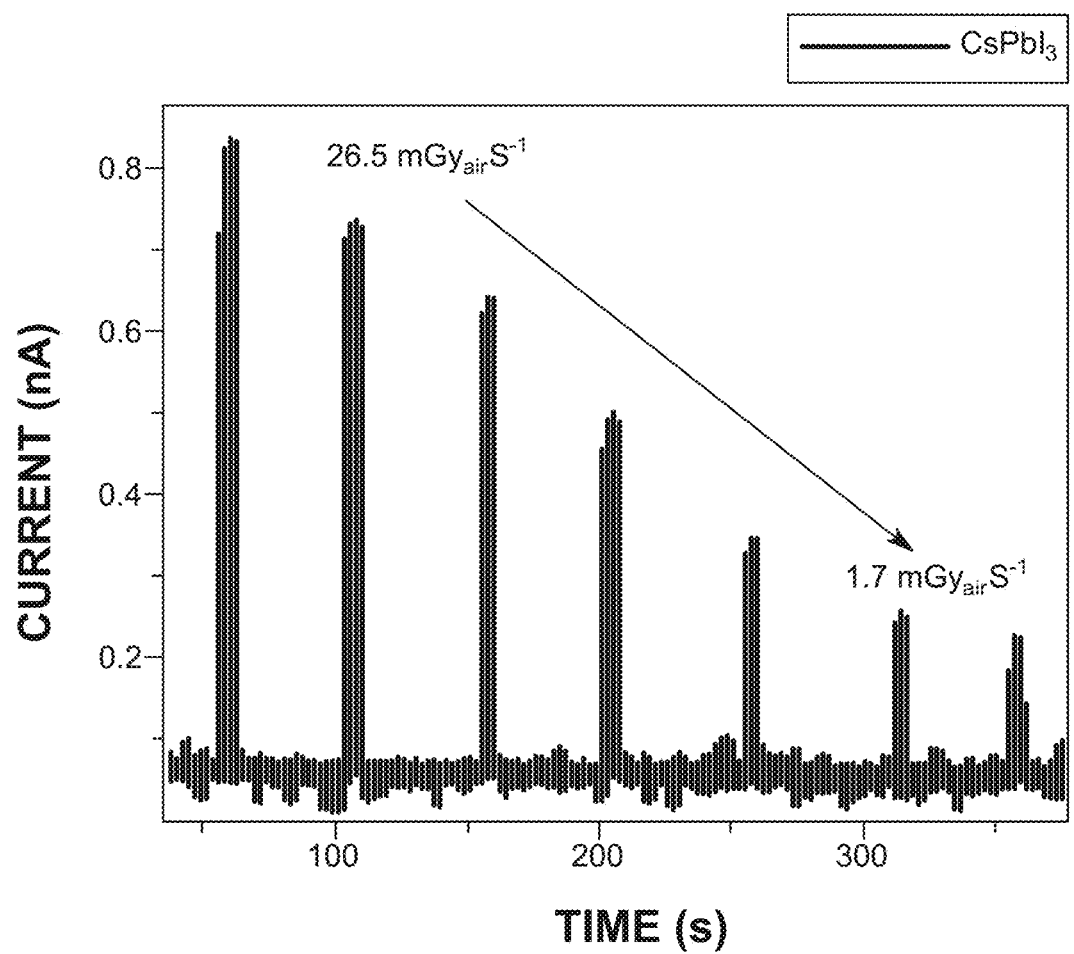
FIG. 13 illustrates the I-T curve of the CsPbI$_3$ material as a function of the dose, which is varied by controlling an X-ray tube current, while the X-ray tube acceleration bias is maintained at 60 kV.

The experiments performed with the X-ray sensor 1000 indicated that the perovskite material was sensitive to a lower dose of 1.7 $mGy_{air}s^{-1}$ with a 4 times on/off ratio, as shown in FIG. 13. This on/off ratio is similar to that reported by [9] under a much higher dose (5.86 $mGy_{air}s^{-1}$) and a higher electron field (0.2 V$\mu m^{-1}$), indicating the superior characteristics of the X-ray device 1000. The highest sensitivity of the CsPbI$_3$ device 1000 was found to be 83.6 $\mu CGy_{air}^{-1}$ cm$^{-2}$, which is much higher than that reported for an amorphous silicon detector (0.3 $\mu CGy_{air}^{-1}$ cm$^{-2}$) and α-Se detectors (20 $\mu CGy_{air}^{-1}$ cm$^{-2}$), while it is comparable to the results reported by [8] and [10] although the active layer 1010 in the device 1000 is ultra-thin (about 6.6 µm).

In one embodiment, the X-ray detector 1000 that uses the ultra-thin perovskite (about 6.6 µm for CsPbI$_3$) is up to 1000 times thinner relative to the bulk active layer that is used in the commercial devices, for which the thickness ranges from 100 µm to a few mm. Although this device architecture can result in lower sensitivity, the response is still superior compared to devices reported in literature and can be beneficial for portable, cost-effective, X-ray detectors with high sensitivity and a simple design, free from light interference noise. A perovskite X-ray detector has a similar device structure to a photodetector, but requires a much thicker active layer for absorbing the X-rays efficiently. Thus, the perovskite layer thickness is a parameter that is controlled for achieving a desired device sensitivity. However, when the perovskite layer is too thick, it will be challenging to obtain high spatial resolution. Owing to its high absorption, even a thin layer of $CsPbX_3$ could yield high sensitivity.

Figure 14:
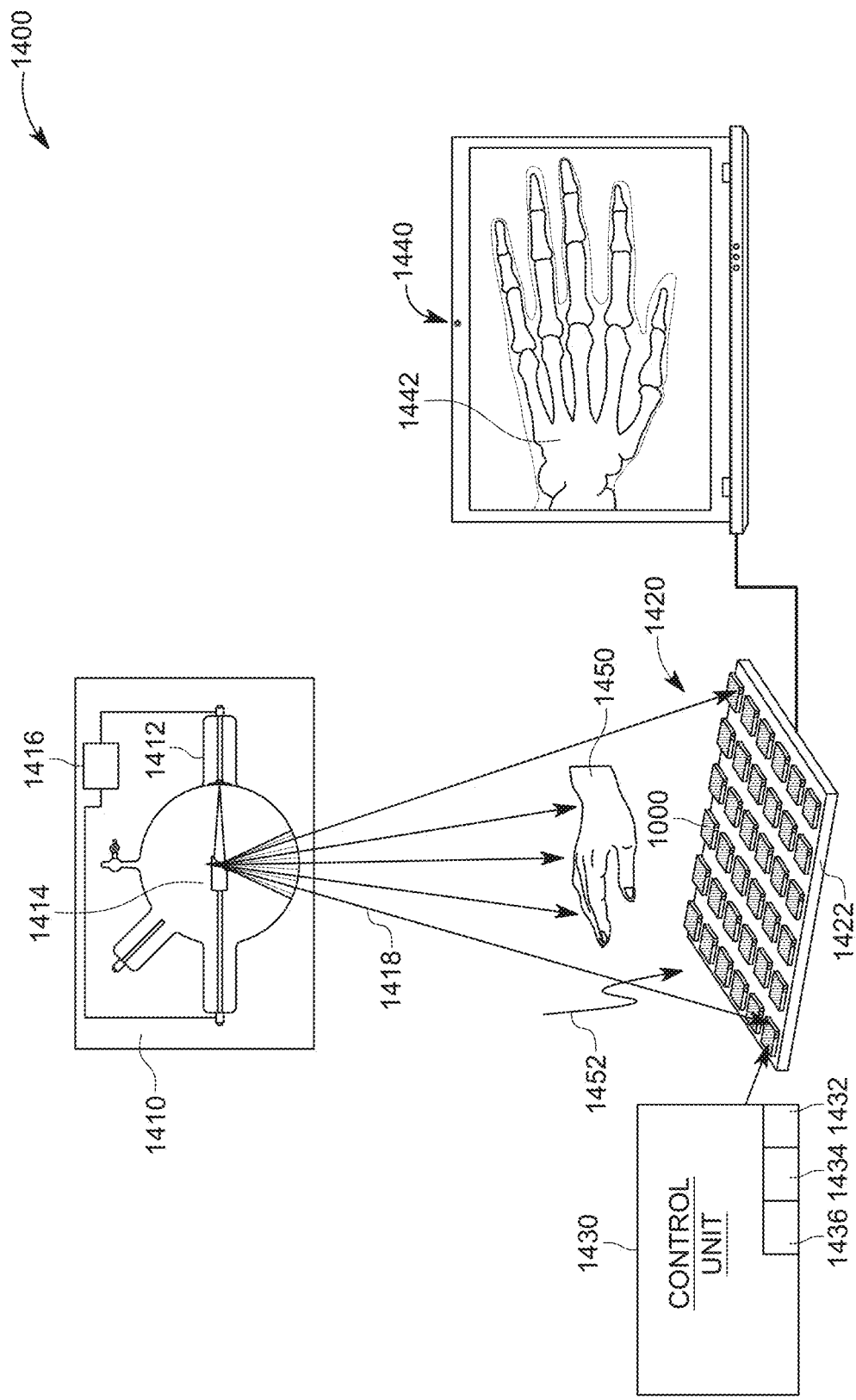
FIG. 14 illustrates an X-ray system that uses one of the four perovskite based semiconductor materials as an active material for the X-ray sensor.
Figure 15:
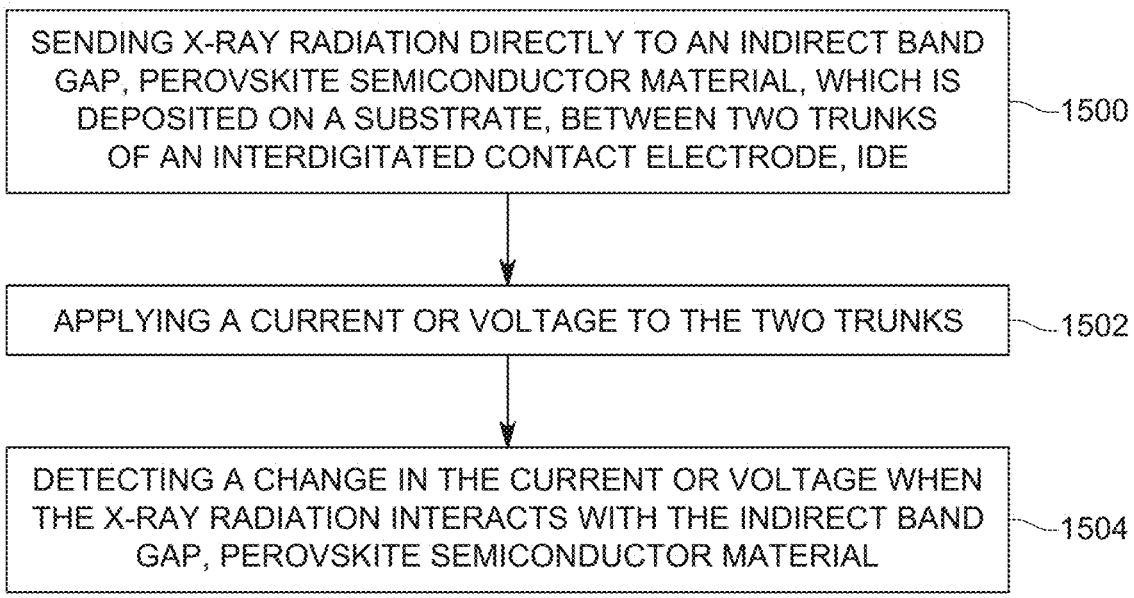
FIG. 15 is a flowchart of a method for recording X-ray radiation with one of the four perovskite based semiconductor materials.

An X-ray detection system 1400 is illustrated in FIG. 14. The X-ray detection system 1400 includes an X-ray generation unit 1410, an X-ray detection unit 1420, a controller 1430, and an image generation unit 1440. The X-ray generation unit 1410 may include a cathode 1412 and an anticathode 1414 that are electrically powered by a power source 1416 for accelerating electrical charges (e.g., electrons) between the cathode and the anticathode. As a result of the interaction of the anticathode 1414 with the electrical charges, X-ray radiation 1418 is generated at the X-ray generation unit 1410. Other X-ray generation mechanisms or devices may be used for generating the X-ray radiation. The X-ray radiation 1418 is then directed to an object intended to be studied, for example, a human hand 1450 in this embodiment. The radiation passing through the object 1450 is then recorded by one or more X-ray sensors 1000 of the X-ray detection unit 1420. In one application, the X-ray sensors 1000 are placed on a common substrate 1422 of the X-ray detection unit 1420. Note that the X-ray sensors 1000, which were discussed with regard to FIGS. 10A and 10B, do not need any additional layers to stop or minimize the ambient visible and/or UV light 1452, which traditionally negatively impacts the existing X-ray sensors. In other words, the X-ray detection unit 1420 can have the X-ray sensor 1000 directly exposed to the X-ray radiation 1450 and to the ambient visible/UV light 1452 without negatively affecting the sensor's efficiency.

The control unit 1430 may include a processor 1432 and a memory 1434 that are configured to control the one or more X-ray sensors 1000, the X-ray generation unit 1410, and the X-ray image generation unit 1440. For example, the memory 1434 may store various instructions and the processor 1432 is programmed to run these instructions, for example, adjust the voltage applied to the X-ray sensor 1000, or to the X-ray generation unit 1410, process the data collected from the X-ray sensors 1000 and generate an image 1442 of the object 1450, on the screen of the X-ray image generation unit 1440, which may be a monitor. The control unit 1430 may also include an input/output interface 1436, which offers the operator of the system the opportunity to interact with the control unit for sending commands or receiving data.

According to an embodiment, a method for recording X-ray radiation with the X-ray sensor 1000 includes a step 1500 of sending X-ray radiation 1418 directly to an indirect bandgap, perovskite semiconductor material 1010, which is deposited on a substrate 1002, between two trunks 1009A, 1009B of an interdigitated contact electrode, IDE, 1008, a step 1502 of applying a current or voltage to the two trunks 1009A, 1009B, and a step 1504 of detecting a change in the current or voltage when the X-ray radiation 1418 interacts with the indirect bandgap, perovskite semiconductor material 1010. The change is indicative of the X-ray radiation. In one application, the indirect bandgap, perovskite semiconductor material is $CsPbI_3$ or $CsPbBrI_2$ or $CsPbBr_2I$.

The above discussed embodiments present a novel concept based on applying solution-processed iodine $CsPbX_3$ for X-ray detection. As indirect bandgap materials are ideal candidates for the active layer of an X-ray sensor, such sensors exhibit high sensitivity to X-ray radiation while avoiding noise caused by UV/visible light. The highest sensitivity of 83.6 $\mu CGy_{air}^{-1}$ $cm^{-2}$ was obtained despite using an ultra-thin (~6.6 μm) active layer for the first time. The lowest dose of 1.7 $mGy_{air}s^{-1}$ with a 4 times on/off ratio was observed for the studied perovskite materials. Due to the higher $CsPbI_3$ absorption relative to CdTe, a much higher sensitivity and much lower minimum detectable dose rate is expected when the active layer is sufficiently thick, demonstrating that the novel X-ray sensor can be used for producing cost-effective low-noise X-ray detectors, as well as portable X-ray nano-detectors that would benefit from an ultra-thin layer.

The disclosed embodiments provide an X-ray sensor, X-ray system, and method for generating an X-ray image of an object, wherein the X-ray sensor uses a perovskite based material that has high X-ray sensitivity and low visible/UV light interference. It should be understood that this description is not intended to limit the invention. On the contrary, the embodiments are intended to cover alternatives, modifications and equivalents, which are included in the spirit and scope of the invention as defined by the appended claims. Further, in the detailed description of the embodiments, numerous specific details are set forth in order to provide a comprehensive understanding of the claimed invention. However, one skilled in the art would understand that various embodiments may be practiced without such specific details.

Although the features and elements of the present embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

REFERENCES

[1] L. Protesescu, S. Yakunin, M. I. Bodnarchuk, F. Krieg, R. Caputo, C. H. Hendon, R. X. Yang, A. Walsh, and M. V. Kovalenko., Nano Lett, 2015, 15, 3692.

[2] M. D. Birowosuto, D. Cortecchia, W. Drozdowski, K. Brylew, W. Lachmanski, A. Bruno, C. Soci. Sci Rep, 2016, 6, 37254.

[3] Q. Chen, J. Wu, X. Ou, B. Huang, J. Almutlaq, A. A. Zhumekenov, X. Guan, S. Han, L. Liang, Z. Yi, J. Li, X. Xie, Y. Wang, Y. Li, D. Fan, D. B. L. Teh, A. H. All, O. F. Mohammed, O. M. Bakr, T. Wu, M. Bettinelli, H. Yang, W. Huang, X. Liu. Nature, 2018, 561, 88.

[4] P. Buchele, M. Richter, S. F. Tedde, G. J. Matt, G. N. Ankah, R. Fischer, M. Biele, W. Metzger, S. Lilliu, O. Bikondoa. Nature Photonics, 2015, 9, 843.

[5] F. Moretti, G. Patton, A. Belsky, M. Fasoli, A. Vedda, M. Trevisani, M. Bettinelli, C. Dujardin. J Phys Chem C, 2014, 118, 9670.

[6] V. Nagarkar, T. Gupta, S. Miller, Y. Klugerman, M. Squillante, G. Entine. IEEE Trans Nucl Sci, 1998, 45, 492.

[7] Y. Zhang, R. Sun, X. Ou, K. Fu, Q. Chen, Y. Ding, L.-J. Xu, L. Liu, Y. Han, A. V. Malko, X. Liu, H. Yang, O. M. Bakr, H. Liu, O. F. Mohammed. ACS Nano, 2019, 13, 2520.

[8] W. Pan, H. Wu, J. Luo, Z. Deng, C. Ge, C. Chen, X. Jiang, W.-J. Yin, G. Niu, L. Zhu, L. Yin, Y. Zhou, Q. Xie, X. Ke, M. Sui, J. Tang. Nature Photonics, 2017, 11, 726.

[9] S. Shrestha, R. Fischer, G. J. Matt, P. Feldner, T. Michel, A. Osvet, I. Levchuk, B. Merle, S. Golkar, H. Chen, S. F. Tedde, O. Schmidt, R. Hock, M. Ruhrig, M. Göken, W. Heiss, G. Anton, C. J. Brabec. Nature Photonics, 2017, 11, 436.

[10] H. Wei, Y. Fang, P. Mulligan, W. Chuirazzi, H.-H. Fang, C. Wang, B. R. Ecker, Y. Gao, M. A. Loi, L. Cao, J. Huang. Nature Photonics, 2016, 10, 333.

[11] S. Yakunin, M. Sytnyk, D. Kriegner, S. Shrestha, M. Richter, G. J. Matt, H. Azimi, C. J. Brabec, J. Stangl, M. V. Kovalenko, W. Heiss. Nat Photonics, 2015, 9, 444.

[12] B. Xin, Y. Pak, S. Mitra, D. Almalawi, N. Alwadai, Y. Zhang, I. S. Rogan. ACS Appl Mater Interfaces, 2019, 11, 5223.

What is claimed is:

1. An X-ray system comprising:
   an X-ray generation unit configured to generate X-rays;
   an X-ray detection unit including at least one X-ray sensor that includes an indirect bandgap, perovskite semiconductor material, the X-ray sensor being configured to record the X-rays; and
   a control unit that controls a generation of the X-rays and a detection of the X-rays at the X-ray detection unit,
   wherein the X-ray detection unit includes,
   a substrate, and
   an interdigitated contact electrode (IDE) formed on the substrate, the IDE having two trunks and each trunk having plural branches,
   wherein the indirect bandgap, perovskite semiconductor material is directly located on the substrate, between the plural branches, and
   wherein the indirect bandgap, perovskite semiconductor material has an orthorhombic δ-phase.

2. The X-ray system of claim 1,
   wherein the indirect bandgap, perovskite semiconductor material has a thickness of 10 μm or less.

3. The X-ray system of claim 2, wherein the X-ray sensor is not covered with a layer for blocking visible or UV light.

4. The X-ray system of claim 1, wherein the X-ray sensor is configured to receive the X-rays and visible and UV light, but the indirect bandgap, perovskite semiconductor material is substantially insensitive to the visible and UV light.

5. The X-ray system of claim 1, wherein the indirect bandgap, perovskite semiconductor material is $CsPbI_3$.

6. The X-ray system of claim 1, wherein the indirect bandgap, perovskite semiconductor material is $CsPbBrI_2$.

7. The X-ray system of claim 1, wherein the indirect bandgap, perovskite semiconductor material is $CsPbBr_2I$.

8. The X-ray system of claim 1, wherein the indirect bandgap, perovskite semiconductor material requires a photon exchange and a phonon exchange so that a charge carrier jumps between a valence band and a conduction band.

9. The X-ray system of claim 1, wherein the indirect bandgap, perovskite semiconductor material is deposited as nanorods between the trunks of the IDE.

10. The X-ray system of claim 1, wherein the indirect bandgap, perovskite semiconductor material is deposited as nanosheets between the trunks of the IDE.

11. An X-ray sensor for determining X-ray radiation, the X-ray sensor comprising:
    a substrate;
    an interdigitated contact electrode, IDE, formed on the substrate, the IDE having two trunks and each trunk having plural branches; and
    an indirect bandgap, perovskite semiconductor material directly located on the substrate, between the two trunks,
    wherein the indirect bandgap, perovskite semiconductor material has an orthorhombic δ-phase.

12. The X-ray sensor of claim 11, wherein the indirect bandgap, perovskite semiconductor material is $CsPbI_3$.

13. The X-ray sensor of claim 11, wherein the indirect bandgap, perovskite semiconductor material is $CsPbBrI_2$.

14. The X-ray sensor of claim 11, wherein the indirect bandgap, perovskite semiconductor material is $CsPbBr_2I$.

15. The X-ray sensor of claim 11, wherein the indirect bandgap, perovskite semiconductor material requires a photon exchange and a phonon exchange so that a charge carrier jumps between a valence band and a conduction band.

16. The X-ray sensor of claim 11, wherein the indirect bandgap, perovskite semiconductor material is deposited as nanorods or nanosheets between the branches of the IDE and has a thickness of 10 pm or less.

17. The X-ray sensor of claim 11, wherein the indirect bandgap, perovskite semiconductor material is not covered with a layer for blocking visible and UV light.

18. The X-ray sensor of claim 11, wherein the indirect bandgap, perovskite semiconductor material is configured to receive the X-ray radiation and visible and UV light, but the indirect bandgap, perovskite semiconductor material is substantially insensitive to the visible and UV light.

19. A method for recording X-ray radiation, the method comprising:
    sending X-ray radiation directly to an indirect bandgap, perovskite semiconductor material, which is directly located on a substrate, between two trunks of an interdigitated contact electrode, IDE;
    applying a current or voltage between the two trunks; and
    detecting a change in the current or voltage when the X-ray radiation interacts with the indirect bandgap, perovskite semiconductor material,
    wherein the change is indicative of the X-ray radiation, and
    wherein the indirect bandgap, perovskite semiconductor material has an orthorhombic δ-phase.

20. The method of claim 19, wherein the indirect bandgap, perovskite semiconductor material is $CsPbI_3$ or $CsPbBrI_2$ or $CsPbBr_2I$.

* * * * *